(12) United States Patent
Lefevre

(10) Patent No.: US 10,944,504 B2
(45) Date of Patent: Mar. 9, 2021

(54) TRANSMISSION OF PROBABILISTICALLY SHAPED AMPLITUDES USING PARTIALLY ANTI-SYMMETRIC AMPLITUDE LABELS

(71) Applicant: Nokia Solutions and Networks Oy, Espoo (FI)

(72) Inventor: Yannick Lefevre, Antwerp (BE)

(73) Assignee: NOKIA SOLUTIONS AND NETWORKS OY, Espoo (FI)

( * ) Notice: Subject to any disclaimer, the term of this patent is extended or adjusted under 35 U.S.C. 154(b) by 11 days.

(21) Appl. No.: 16/407,543

(22) Filed: May 9, 2019

(65) Prior Publication Data
US 2020/0044770 A1  Feb. 6, 2020

Related U.S. Application Data

(60) Provisional application No. 62/713,822, filed on Aug. 2, 2018.

(51) Int. Cl.
*H04L 1/00* (2006.01)
*H03M 13/11* (2006.01)
(Continued)

(52) U.S. Cl.
CPC ....... *H04L 1/0041* (2013.01); *H03M 13/1102* (2013.01); *H03M 13/2906* (2013.01); *H04J 1/045* (2013.01); *H04L 27/0002* (2013.01)

(58) Field of Classification Search
CPC . H04L 1/0041; H04L 27/0002; H04L 1/0042; H04L 1/0065; H04L 1/0058;
(Continued)

(56) References Cited

U.S. PATENT DOCUMENTS

| 7,400,609 B2 | 7/2008 | Hammerschmidt |
| 7,778,341 B2 | 8/2010 | Tong et al. |

(Continued)

FOREIGN PATENT DOCUMENTS

| WO | WO2010005470 A2 | 1/2010 |
| WO | WO2010019168 A1 | 2/2010 |
| WO | 2018121887 A1 | 7/2018 |

OTHER PUBLICATIONS

Boutros, Joseph J. et al., "Probabilistic Shaping and Non-Binary Codes", Arxiv.org, Cornell University Library, Jan. 27, 2017, (5 pages).

(Continued)

*Primary Examiner* — Thien Nguyen
(74) *Attorney, Agent, or Firm* — Mendelsohn Dunleavy, P.C.; Yuri Gruzdkov

(57) ABSTRACT

A communication system in which a constellation employing partially anti-symmetric amplitude labels is used to transmit probabilistically shaped amplitudes such that said amplitudes are also used to determine the signs applied thereto for transmission. In an example embodiment, a data transmitter is configured to use a suitable logic function (e.g., an XOR function) to place the parity generated by an FEC code into a selected amplitude bit while using the partially anti-symmetric amplitude labels to avoid placing the parity into the sign bits of the transmitted constellation symbols. In some embodiments, the FEC code can be a low-density parity-check code. Some embodiments are compatible with layered FEC coding, e.g., employing an outer FEC code and an inner FEC code. In some embodiments, FEC coding may be optional. Some embodiments can advantageously be used in communication systems relying on DMT modulation, such as the systems providing DSL access over copper wiring.

19 Claims, 12 Drawing Sheets

(51) Int. Cl.
*H03M 13/29* (2006.01)
*H04J 1/04* (2006.01)
*H04L 27/00* (2006.01)

(58) Field of Classification Search
CPC ............... H04L 1/0047; H04L 27/3411; H04L 25/03828; H04J 1/045; H03M 13/2906; H03M 13/1102; H04B 14/023
See application file for complete search history.

(56) References Cited

U.S. PATENT DOCUMENTS

| | | | |
|---|---|---|---|
| 8,144,807 | B2 | 3/2012 | Mirfakhraei et al. |
| 8,363,749 | B2 | 1/2013 | Lee et al. |
| 9,407,398 | B2 | 8/2016 | Batshon et al. |
| 9,673,907 | B1 | 6/2017 | Vassilieva et al. |
| 9,882,659 | B2 | 1/2018 | Fine et al. |
| 9,893,919 | B2 | 2/2018 | Kim et al. |
| 9,929,813 | B1 | 3/2018 | Batshon et al. |
| 10,091,046 | B1 | 10/2018 | Lefevre |
| 10,200,231 | B1 | 2/2019 | Lefevre et al. |
| 2005/0286620 | A1 | 12/2005 | Peng |
| 2009/0103646 | A1 | 4/2009 | Dowling et al. |
| 2009/0180495 | A1 | 7/2009 | Li et al. |
| 2016/0072659 | A1 | 3/2016 | Stadelmeier et al. |
| 2018/0026725 | A1 | 1/2018 | Cho |
| 2018/0083716 | A1 | 3/2018 | Cho et al. |
| 2018/0262274 | A1 | 9/2018 | Yu et al. |
| 2018/0269979 | A1 | 9/2018 | Zhang et al. |
| 2019/0158238 | A1 | 5/2019 | Lefevre et al. |
| 2020/0008095 | A1* | 1/2020 | Patil ..................... H04W 4/06 |
| 2020/0106579 | A1* | 4/2020 | Cherian ............... H04L 5/0032 |

OTHER PUBLICATIONS

Extended European Search Report for corresponding European application No. 19186894.2; dated Dec. 13, 2019 (10 pages).
Böcherer, G., et al., "Bandwidth efficient and rate-matched low-density parity-check coded modulation," IEEE Transactions on Communications, vol. 63, No. 12, pp. 4651-4665, 2015.
Cho, J., et al., "Trans-Atlantic Field Trial Using Probabilistically Shaped 64-QAM at High Spectral Efficiencies and Single-Carrier Real-Time 250-Gb/s 16-QAM," OFC Conference, Optical Society for America. pp. Th5B.3, 2017.
Futurewei Technologies, "G.fast: Performance of LDPC Coded Modulation," ITU-T Q4/15 Contribution 2017-02-Q4-034, Feb. 2017.
Idler, W., et al., "Field Trial of a 1 Tb/s Super-Channel Network Using Probabilistically Shaped Constellations," J. Lightwave Technol., vol. 35, No. 8, pp. 1399-1406, Apr. 2017.
Nokia Corporation, "G.mgfast: Probabilistic amplitude shaping (PAS) for G.mgfast" ITU-T Q4/15 Contribution T17-SG15RGM-Q4-171127-C-0025, Nov. 2017.
Stojkovic, N. "ADSL Analog Front End." Automatika-Zagreb—vol. 47. No. 1-2 (2006): pp. 59-67.
Lefevre, Y., et al., "Multi-Code Probabilistic Signal Shaping Using Frequency-Division Multiplexing," U.S. Appl. No. 15/817,537, filed Nov. 2017.

Marvell Semiconductors, "Evolution of G.hn: Agreement to support the generic Multi Level Coding scheme," ITU-T Q18/15 Contribution 2017-01-Q18-023, Jan. 2017.
Forney, G. D. "Trellis shaping." IEEE Transactions on Information Theory 38.2 (1992): 281-300.
Jones, Edward. "Introduction to DSL." Fundamentals of DSL Technology. Auerbach Publications, 2005. 131-154.
Che, Di et al., "Entropy-loading: multi-carrier constellation-shaping for colored-SNR optical channels." 2017 Optical Fiber Communications Conference and Exhibition (OFC). IEEE, 2017.
Arafa, T., W. Sauer-Greff, and R. Urbansky. "Performance of combined constellation shaping and bit interleaved coded modulation with iterative decoding (bicm-id)." Advances in Radio Science: ARS 9 (2011): 195.
Amjad, Rana Ali, and Georg Böcherer. "Fixed-to-variable length distribution matching." Information Theory Proceedings (ISIT), 2013 IEEE International Symposium on. IEEE, 2013.
Peng, Linning, Maryline Hélard, and Sylvain Haese. "On bit-loading for discrete multi-tone transmission over short range POF systems." Journal of lightwave technology 31.24 (2013): 4155-4165.
Schulte, Patrick, and Georg Böcherer. "Constant composition distribution matching." IEEE Transactions on Information Theory 62.1 (2016): 430-434.
Pan, Chunpo, and Frank R. Kschischang. "Probabilistic 16-QAM shaping in WDM systems." Journal of Lightwave Technology 34.18 (2016): 4285-4292.
Fehenberger, Tobias, et al. "On probabilistic shaping of quadrature amplitude modulation for the nonlinear fiber channel." Journal of Lightwave Technology 34.21 (2016): 5063-5073.
Böcherer, G., et al., "High throughput probabilistic shaping with product distribution matching." arXiv preprint arXiv:1702.07510 (2017).
Wei, D., "G.mgfast: Constellation Shaping on LDPC Coded Modulation," Study Group 15, International Telecommunication Union, Telecommunication Standardization Sector, Sep. 2017, pp. 1-6.
Chen, X. et al., "Single-Wavelength, Single-Polarization, Single-Photodiode Kramers-Kronig Detection of 440-Gb/s Entropy-Loaded Discrete Multitone Modulation Transmitted over 100-km SSMF", 2017 IEEE Photonics Conference (IPC) Part II. IEEE, 2017.
Wyglinski, Alexander M. et al., "Digital communication systems engineering with software-defined radio", Artech House, 2013. pp. 187-187.
International Search Report and Written Opinion for International Patent Application No. PCT/EP2018/081490; dated Mar. 19, 2019.
Eleftheriou, Evangelos, and S. Olcer. "Low-density parity-check codes for digital subscriber lines." Communications, 2002. ICC 2002. IEEE International Conference on. vol. 3. IEEE, 2002.
Fehenberger, Tobias, et al. "LDPC coded modulation with probabilistic shaping for optical fiber systems." Optical Fiber Communication Conference. Optical Society of America, 2015, 3 pages.
Steiner, Fabian, and Patrick Schulte. "Design of robust, protograph based LDPC codes for Rate-Adaptation via probabilistic shaping." Turbo Codes and Iterative Information Processing (ISTC), 2016 9th International Symposium on. IEEE, 2016, pp. 5 pages.

* cited by examiner

100

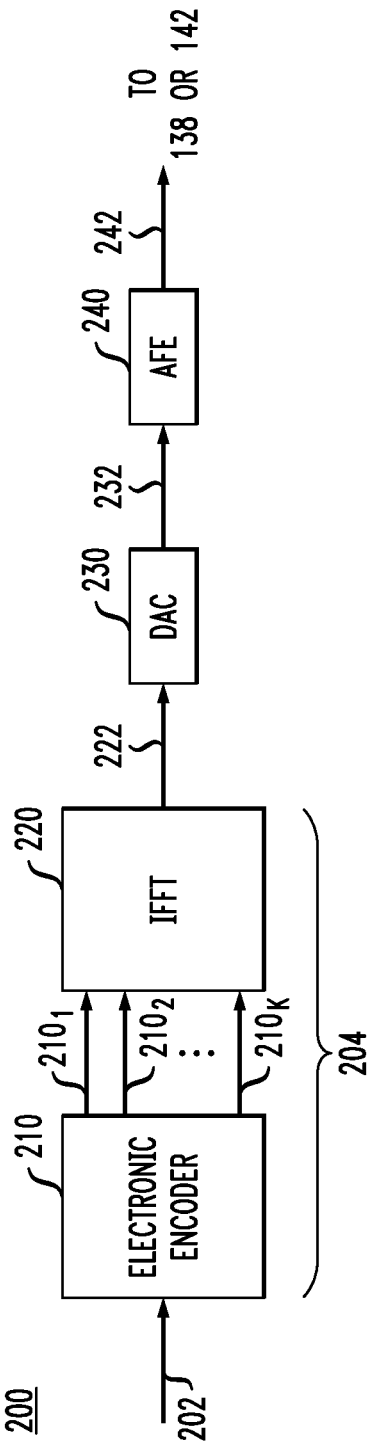
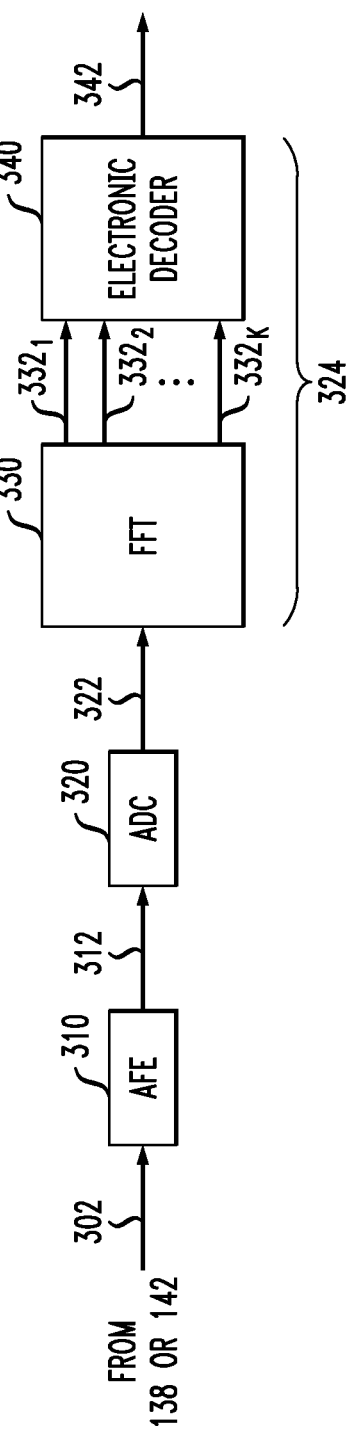

400

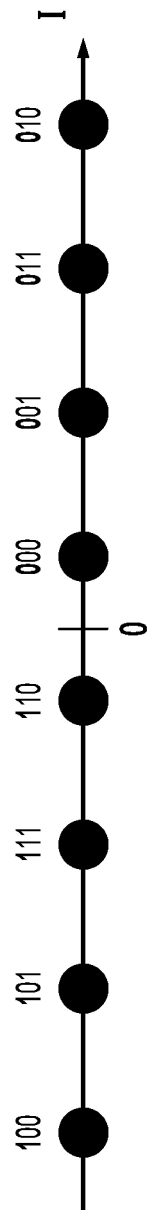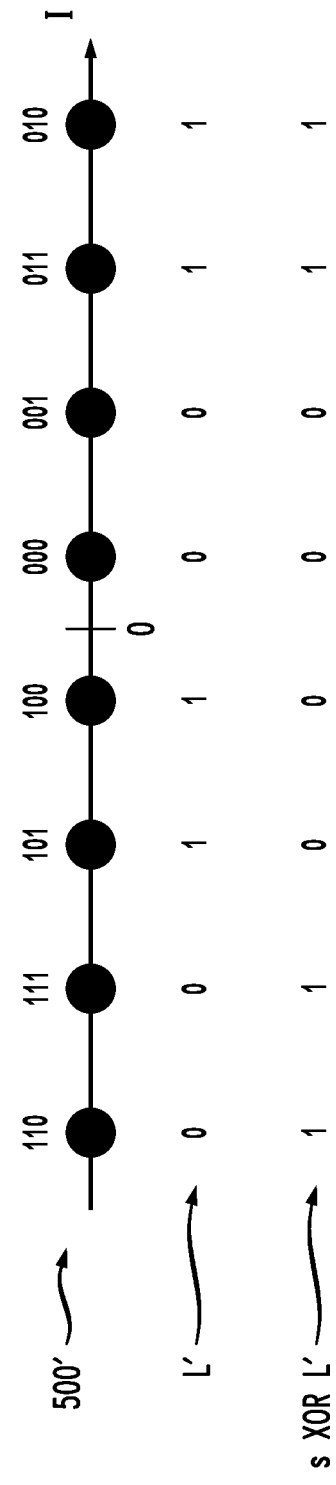
FIG. 5A
500
FIG. 5B
500'

600

700

800

1100

TRANSMISSION OF PROBABILISTICALLY SHAPED AMPLITUDES USING PARTIALLY ANTI-SYMMETRIC AMPLITUDE LABELS

CROSS-REFERENCE TO RELATED APPLICATIONS

This application claims the benefit of U.S. Provisional Patent Application No. 62/713,822, filed on 2 Aug. 2018, and entitled "LAYERED CODING USING PROBABILISTIC SIGNAL SHAPING AND FORWARD ERROR CORRECTION," which is incorporated herein by reference in its entirety.

BACKGROUND

Field

Various example embodiments relate to optical communication equipment and, more specifically but not exclusively, to methods and apparatus for transmitting and receiving communication signals using probabilistic signal shaping and optional forward error correction (FEC).

Description of the Related Art

This section introduces aspects that may help facilitate a better understanding of the disclosure. Accordingly, the statements of this section are to be read in this light and are not to be understood as admissions about what is in the prior art or what is not in the prior art.

Signal shaping can provide energy savings often referred to as the shaping gain. In a typical implementation of signal shaping, constellation symbols of relatively large energy are transmitted less frequently than constellation symbols of relatively small energy. For a linear communication channel, the shaping gain can theoretically approach 1.53 dB.

A representative systematic FEC code is used to convert an input bit sequence into an expanded bit sequence (FEC codeword) by appending to the input bit sequence a corresponding set of parity bits. Some well-performing FEC codes are low-density parity-check (LDPC) codes. LDPC codes are linear block codes that have parity check matrices with a relatively small number of nonzero elements in each row and column. An LDPC decoder may use soft information during decoding, which information can be generated by a soft information detector, e.g., relying on a soft-output algorithm, such as the Viterbi algorithm, the Bahl-Cocke-Jelinek-Raviv algorithm, or a belief-propagation algorithm.

Frequency-division multiplexing (FDM) is a method of transmitting data on multiple carrier frequencies that can be used in wireline, wireless, and optical communication channels. Different variants of FDM are used in various forms of wideband digital communications, digital television, audio broadcasting, digital subscriber line (DSL) or G.fast or G.mgfast Internet access, local area networks (LANs), home networks, 4G or 5G mobile-access networks, etc. Some variants of FDM, typically collectively referred to as discrete multi-tone (DMT) modulation, are used in wireline communication channels established over, e.g., plain old telephone service (POTS) copper wiring, coaxial cable, and/or power lines. Some FDM schemes use orthogonal frequency-division multiplexing (OFDM).

At least some communication systems can benefit from the use of various combinations and sub-combinations of signal shaping, forward error correction, and/or frequency-division multiplexing.

SUMMARY OF SOME SPECIFIC EMBODIMENTS

Disclosed herein are various embodiments of a communication system in which a constellation employing partially anti-symmetric amplitude labels is used to transmit probabilistically shaped amplitudes such that said amplitudes are also used to determine the signs applied thereto for transmission. In an example embodiment, a data transmitter is configured to use a suitable logic function (e.g., an XOR function) to place the parity generated by an FEC code into a selected amplitude bit while using the partially anti-symmetric amplitude labels to avoid placing the parity into the sign bits of the transmitted constellation symbols. In some embodiments, the FEC code can be a low-density parity-check code. Some embodiments are compatible with layered FEC coding, e.g., employing an outer FEC code and an inner FEC code. In some embodiments, FEC coding may be optional. Some embodiments can advantageously be used in communication systems relying on DMT modulation, such as the systems providing DSL or G.fast access over copper wiring.

Also disclosed are data receivers compatible with the disclosed data transmitters.

According to an example embodiment, provided is an apparatus comprising a data transmitter that comprises an electrical analog front end and a digital signal processor, the digital signal processor being configured to: redundancy-encode an input data stream to generate a constellation-symbol stream; and drive the analog front end to cause one or more modulated electrical carriers generated by the analog front end to carry constellation symbols of the constellation-symbol stream; and wherein the digital signal processor comprises: a demultiplexer configured to demultiplex the input data stream to generate a first sub-stream and a second sub-stream; a shaping encoder configured to generate a first encoded data stream and a second encoded data stream (by applying a shaping code to the first sub-stream; and a constellation mapper configured to: use the second encoded data stream to select constellation-symbol amplitudes for the constellation-symbol stream; and use the first encoded data stream and the second sub-stream to select at least some signs applied to the constellation-symbol amplitudes.

According to another example embodiment, provided is a apparatus comprising a data receiver that comprises an electrical analog front end and a digital signal processor, the digital signal processor being configured to process a stream of values representing one or more modulated carriers of a received electrical signal outputted by the electrical analog front end and corresponding to a stream of transmitted constellation symbols of a constellation, the digital signal processor being configured to redundancy-decode the stream of values to recover a source data stream redundancy-encoded in the stream of transmitted constellation symbols and carried by the one or more modulated electrical carriers; and wherein the digital signal processor comprises: a constellation demapper configured to generate a first data stream and a second data stream by mapping each of the stream of values onto the constellation, the first data stream carrying sign bits of binary labels of constellation symbols determined by the mapping, the second stream carrying amplitude bits of the binary labels of the constellation symbols determined by the mapping; and a shaping decoder configured to recover a first sub-stream of the source data stream by decoding a stream of bit-words generated using the first and second data streams, the decoding being performed using a shaping code.

BRIEF DESCRIPTION OF THE DRAWINGS

Other aspects, features, and benefits of various disclosed embodiments will become more fully apparent, by way of example, from the following detailed description and the accompanying drawings, in which:

FIG. 2 shows a block diagram of a transmitter that can be used in the DMT system of FIG. 1 according to an embodiment;

FIG. 3 shows a block diagram of a receiver that can be used in the DMT system of FIG. 1 according to an embodiment;

FIGS. 5A-5B show example labeling schemes that can be used to implement the digital circuit of FIG. 4 according to an embodiment;

DETAILED DESCRIPTION

Some embodiments disclosed herein may benefit from the use of one or more features disclosed in U.S. Pat. Nos. 10,091,046 and 10,200,231 and U.S. patent application Ser. No. 15/817,537, each of which is incorporated herein by reference in its entirety.

The following acronyms/abbreviations are used in the description of various embodiments and/or in the accompanying drawings:
ADC Analog-to-Digital Converter;
AFE Analog Front End;
ARQ Automatic Repeat reQuest;
AWGN Additive White Gaussian Noise;
CPE Customer Premise Equipment;
CRC Cyclic Redundancy Check;
DAC Digital-to-Analog Converter;
DMT Discrete Multi-Tone;
DMUX Demultiplexer;
DPU Distribution Point Unit;
DSP Digital Signal Processor;
DSL Digital Subscriber Line;
DTU Data Transfer Unit;
FDM Frequency-Division Multiplexing;
FEC Forward Error Correction;
FFT Fast Fourier Transform;
FIFO Fixed-In/Fixed-Out;
FIVO Fixed-In/Variable-Out;
IFFT Inverse Fast Fourier Transform;
IQ In-phase/Quadrature;
I/O Input/Output;
LAN Local Area Network;
LCM LDPC Coded Modulation;
LDPC Low Density Parity Check;
LLR Log-Likelihood Ratio;
LSB Least-Significant Bit;
MSB Most-Significant Bit;
MUX Multiplexer;
OFDM Orthogonal Frequency-Division Multiplexing;
PAM Pulse Amplitude Modulation;
PAS: Probabilistic Amplitude Shaping;
POTS Plain Old Telephone Service;
QAM Quadrature Amplitude Modulation;
RF Radio Frequency;
RS Reed Solomon;
Rx Receiver;
SNR Signal-to-Noise Ratio;
TCM Trellis-Coded Modulation;
Tx Transmitter;
VIFO Variable-In/Fixed-Out;
VIVO Variable-In/Variable-Out;
XOR eXclusive OR.

Figure 1:
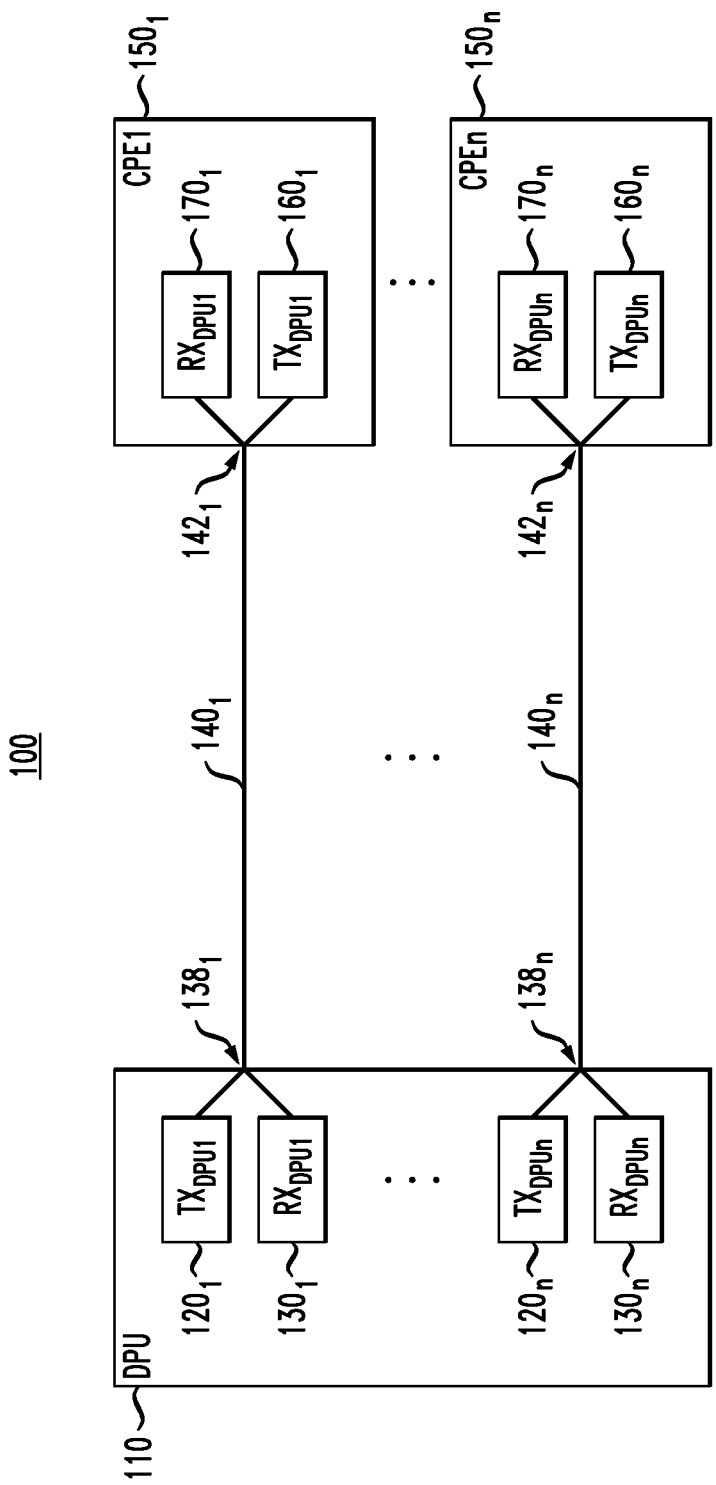
FIG. 1 shows a block diagram of a DMT system in which various embodiments can be practiced.

FIG. 1 shows a block diagram of a DMT system 100 in which various embodiments can be practiced. System 100 comprises a distribution point unit (DPU) 110 and a plurality of customer-premise-equipment (CPE) units $150_1$-$150_n$, connected by way of subscriber lines $140_1$-$140_n$ as indicated in FIG. 1. In some embodiments, DPU 110 may be located at a "central office" of the service provider (e.g., a telephone company). In some other embodiments, DPU 110 may be remotely deployed using one or more backhaul (e.g., optical) links to a location that is closer to subscriber premises than that of the central office, and the corresponding equipment can be physically placed in a street cabinet, on a pole, in the basement of a building, etc. CPE units $150_1$-$150_n$ are typically located at different respective customer sites.

Each of subscriber lines $140_1$-$140_n$ typically comprises a respective "twisted-pair" cable configured to transmit signals corresponding to data services. In some embodiments, legacy signals, such as POTS or ISDN signals, may be frequency-multiplexed with a data-service signal transmitted over the twisted-pair cable. At DPU 110, each of subscriber lines $140_1$-$140_n$ is connected to a respective one of input/output (I/O) ports $138_1$-$138_n$. At the CPE side, each of subscriber lines $140_1$-$140_n$ is similarly connected to a respective one of I/O ports $142_1$-$142_n$, each being an I/O port of a respective one of CPE units $150_1$-$150_n$.

In an example embodiment, DPU 110 comprises a plurality of transceivers ($120_i/130_i$), each internally connected to a respective one of I/O ports $138_1$-$138_n$, where i= 1, 2, . . . , n. A transceiver ($120_i/130_i$) includes a respective transmitter $120_i$ and a respective receiver $130_i$. A CPE unit $150_i$ comprises a transceiver ($160_i/170_i$) internally connected to I/O port $142_i$ of that CPE unit. A transceiver ($160_i/170_i$) includes a respective transmitter $160_i$ and a respective receiver $170_i$. Transmitter $160_i$ can be functionally similar to transmitter $120_i$. Receiver $170_i$ can be functionally similar to receiver $130_i$. Example embodiments of transmitters 120, 160 are described in more detail below in reference to FIGS. 2, 4, 7, 9, and 10. Example embodiments of receivers 130, 170 are described in more detail below in reference to FIGS. 3, 6, 8, 11, and 12.

FIG. 2 shows a block diagram of a transmitter 200 that can be used in system 100 (FIG. 1) according to an embodiment. Transmitter 200 comprises a digital signal processor (DSP) 204, a digital-to-analog converter (DAC) 230, and an analog front end (AFE) 240. Different instances of transmitter 200 can be used to implement some or all of transmitters $120_1$-$120_n$ and/or $160_1$-$160_n$ (FIG. 1).

DSP 204 operates to carry out redundant data encoding and digital carrier multiplexing to generate a digital output signal 222 having encoded thereon an input data stream 202. DAC 230 operates to convert digital signal 222 into an analog form to generate a corresponding analog electrical radio-frequency (RF) signal 232. AFE 240 then converts signal 232 into a form suitable for transmission over a subscriber line 140 and applies a resulting modulated electrical signal 242 to a corresponding I/O port 138 or 142.

In an example embodiment, DSP 204 comprises an electronic encoder 210 and an inverse fast-Fourier-transform (IFFT) module 220. Electronic encoder 210 carries out redundant data encoding that includes, inter alia, probabilistic signal shaping, FEC encoding, and constellation and carrier mapping to generate constellation-symbol sequences $212_1$-$212_K$, each carrying constellation symbols intended for transmission using a different respective tone (carrier wave) of a different respective frequency. IFFT module 220 then uses an inverse Fourier transform, as known in the pertinent art, to perform digital carrier multiplexing, thereby converting sequences $212_1$-$212_K$ into a corresponding time-domain digital signal 222. Depending on the specific embodiment, the number K of tones used in transmitter 200 can be on the order of one hundred, one thousand, or even greater than one thousand.

Example embodiments of electronic encoder 210 are described in more detail below in reference to FIGS. 4, 7, 9, and 10.

AFE 240 can be a conventional transmitter AFE circuit. Example transmitter AFE circuits suitable for implementing AFE 240 are briefly reviewed, e.g., by N. Stojkovic in "ADSL Analog Front End," AUTOMATIKA v. 47 (2006), no. 1-2, pp. 59-67, which is incorporated herein by reference in its entirety.

FIG. 3 shows a block diagram of a receiver 300 that can be used in system 100 (FIG. 1) according to an embodiment. Receiver 300 comprises an AFE 310, an analog-to-digital converter (ADC) 320, and a DSP 324. Different instances of receiver 300 can be used to implement some or all of receivers $130_1$-$130_n$ and/or $170_1$-$170_n$ (FIG. 1).

AFE 310 operates to convert a modulated electrical input signal 302 received through a corresponding I/O port 138 or 142 into a corresponding analog electrical RF signal 312 suitable for digitization in ADC 320. The typical analog signal processing applied to input signal 302 in AFE 310 includes amplification and filtering. Example receiver AFE circuits suitable for implementing AFE 310 are briefly reviewed, e.g., in the above-cited paper by N. Stojkovic. In some embodiments, an AFE 310 and an AFE 240 belonging to the same transceiver or modem can share some circuit elements, such as a clocking system and an electrical hybrid.

ADC 320 operates to sample signal 312 at an appropriate sampling rate to generate a corresponding sequence 322 of digital samples (values).

In an example embodiment, DSP 324 comprises a fast-Fourier-transform (FFT) module 330 and an electronic decoder 340. FFT module 330 uses a Fourier transform, as known in the pertinent art, to perform digital carrier demultiplexing, thereby converting sequence 322 into the corresponding frequency-domain digital sequences $332_1$-$332_K$. Electronic decoder 340 then applies constellation and carrier demapping, error correction, and redundancy decoding to recover the data stream 202 encoded by the corresponding transmitter onto the output signal 242 that caused receiver 300 to receive input signal 302 (also see FIG. 2). The recovered data stream 202 is then directed to external circuits by way of a digital output signal 342.

Example embodiments of electronic decoder 340 are described in more detail below in reference to FIGS. 6, 8, 11, and 12.

ITU standardization has recently started working on the next-generation DSL standard, often referred-to as G.mgfast, as well as on the evolution of the G.hn standard for powerline communications. For both of these standards, new coding and modulation schemes are being considered. For example, for both standards, LDPC-coded modulation (LCM), also known as multi-layered coding, might be used as an FEC scheme capable of improving the performance compared to the current solutions.

Another modulation technique that can be used to further improve the performance is the "shaping" of the transmitted constellations, such as a quadrature amplitude modulation (QAM) constellation. For example, conventional communication systems use QAM constellations uniformly distributed on a square grid to transmit information. This distribution leads to a performance gap of at least 1.53 dB compared to the theoretical capacity for high signal-to-noise ratio (SNR) values. Probabilistic amplitude shaping (PAS) is a practical method that can be used to reduce or close this performance gap. For example, PAS can modify the probabilities with which constellation symbols are transmitted to have an approximately Gaussian-like distribution, such as an approximate Maxwell-Boltzmann distribution over the constellation grid. In comparison to other shaping schemes, PAS may be advantageous in that the amount of shaping can be tuned to match the capacity of a given channel, and that it can be combined with a suitable off-the-shelf LDPC code.

In the description that follows, we focus on the pulse-amplitude modulation (PAM) format. A $2^m$-PAM constellation has $2^m$ distinct constellation points distributed along a 1-dimensional line. Herein, we assume that the constellation points are arranged equidistantly with respect to each other and symmetrically around the origin (zero). Each of the constellation points can be labeled using an m-bit long unique binary label. The extension of the presented description to QAM-modulation is relatively straightforward. For example, two $2^m$-PAM symbols can be combined to construct a $2^{2m}$-QAM symbol by modulating each of the two dimensions of the QAM symbol independently with a respective PAM symbol.

The different bits of the binary label can be assigned different respective "significance" in terms of the overall value of the binary label. For example, the assignment can be such that changing the value of a more significant bit from "1" to "0" leads, on average, to a constellation point that is farther away from the original constellation point compared to when the same is done for a less significant bit. Under this labeling scheme, the binary labels of different constellation points can be parsed into non-overlapping sets of least significant bits (LSBs) and most significant bits (MSBs) in a manner suitable for the encoding and mapping described herein below.

Some example embodiments disclosed herein may be viewed as being based on non-obvious modifications of certain encoders and/or decoders disclosed in the above-cited U.S. Pat. No. 10,091,046. More specifically, U.S. Pat. No. 10,091,046 discloses, inter alia, a PAS-LCM scheme, in which the (c−1) LSBs of the binary label are encoded together with the sign bit by an LDPC code, and the (m−c) MSBs (excluding the sign bit) of the binary label remain uncoded by the LDPC code. All parity bits generated by the LDPC code are placed in (a fraction of) the sign bits.

One feature of this PAS-LCM scheme is that the sign bits are protected by the LDPC code. However, relatively often, the sign bits do not need such protection, e.g., because they tend to be the most reliable bits of the transmitted binary label. In some situations, the latter characteristic may result in some loss in performance compared to that of a legacy LCM scheme.

An example embodiment disclosed herein below can address the above-indicated and possibly other related problems in the state of the art by (i) placing a parity-bit value into a selected LSB position of a PAS-encoded label to replace the original bit value therein and (ii) generating the sign-bit value by applying a suitable logic function (e.g., an XOR function) to said original bit value and said parity bit value. As a result, the above-indicated possible loss in performance can beneficially be mitigated or avoided altogether. Other possible performance benefits of example embodiments are described below in reference to FIG. 13.

Figure 4:
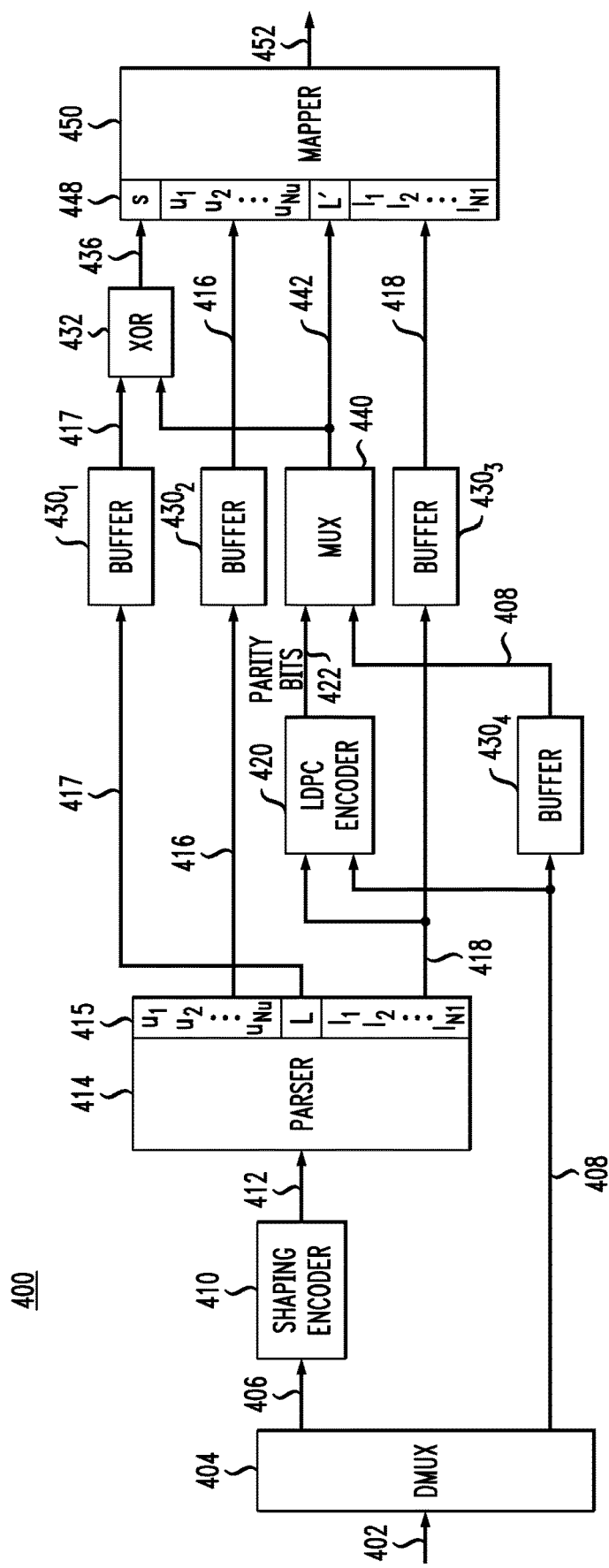
FIG. 4 shows a block diagram of a digital circuit that can be used in the transmitter of FIG. 2 according to an embodiment.

FIG. 4 shows a block diagram of a digital circuit 400 that can be used in transmitter 200 (FIG. 2) according to an embodiment. More specifically, circuit 400 can be a part of electronic encoder 210 and is configured to convert an input data stream 402 into an output stream 452 of constellation symbols, wherein constellation symbols of different amplitudes have different respective rates of occurrence due to the encoding applied by a shaping encoder 410. In some embodiments, electronic encoder 210 may include two or more instances (nominal copies) of circuit 400 connected in parallel with one another.

Input data stream 402 may be configured to carry data transfer units (DTUs) or frames, each of which is a structured data block intended for transmission and, if necessary, retransmission as a whole unit. A typical DTU includes a DTU header, a payload portion, and a cyclic-redundancy-check (CRC) portion. In some embodiments, data stream 402 may not carry an entire DTU. For example, if multiple parallel circuits 400 are used, then each circuit 400 may be configured to process a respective part of a DTU, with different parts of the same DTU being processed by different respective instances of circuit 400. A person of ordinary skill in the art will readily understand how to generate input data stream 402 using input data stream 202 (FIG. 2).

Output stream 452 is typically directed to a carrier mapper that operates to distribute the constellation symbols received from one or more circuits 400 among constellation-symbol sequences $212_1$-$212_K$. As already indicated above, each of constellation-symbol sequences $212_1$-$212_K$ is transmitted using a different respective frequency component of modulated electrical signal 242 (see FIG. 2).

Circuit 400 includes a demultiplexer (DMUX) 404 that partitions input data stream 402 to generate data streams 406 and 408. Data stream 406 is applied to shaping encoder 410. Copies of data stream 408 are applied to an LDPC encoder 420 and a multiplexer (MUX) 440, as indicated in FIG. 4. The relative bit rates of data streams 406 and 408 are determined by the rates of the codes used in shaping encoder 410 and LDPC encoder 420 and by the size(s) of the constellation(s) used in a constellation mapper 450.

In an example embodiment, shaping encoder 410 is configured to carry out fixed-in/fixed-out (FIFO) probabilistic signal shaping under which a fixed-size block of input data 406 is converted into a fixed-size set of bit-words of an output sequence 412. Typically, the statistical properties of input data 406 are similar to those of a random or pseudo-random data sequence. However, different bit-word values in output sequence 412 have different respective rates of occurrence dictated by the shaping code used by shaping encoder 410. In different embodiments, the shaping code can be configured to cause output sequence 412 to have any selected distribution of bit-word values. Some examples of such distributions include, but are not limited to an approximate exponential distribution, an approximate Gaussian distribution, and an approximate Maxwell-Boltzmann distribution. A person of ordinary skill in the art will understand that the shaping code achieves a desired distribution of bit-word values by redundancy-encoding input data 406.

In some embodiments, shaping encoder 410 may be configured to perform the above-mentioned FIFO conversion in a "streaming" fashion such that the ratio between the number of bits supplied by input data 406 and the number of bit-words in the corresponding output sequence 412 remains constant and does not depend on the size or binary contents of input data 406 after the shaping encoder has executed the pertinent initialization procedures. This feature is different from the corresponding feature of some other probabilistic-signal-shaping schemes in which either the size of the input data block or the size of the output set of bit-words, or both, may depend on the binary contents of the input data block. Different variants of such probabilistic-signal-shaping schemes are often referred-to in the relevant literature as variable-in/fixed-out (VIFO), fixed-in/variable-out (FIVO), and variable-in/variable-out (VIVO) schemes.

In some embodiments, shaping encoder 410 may be configured to generate output sequence 412 using a VIFO shaping code.

A person of ordinary skill in the art will appreciate that the shaping code used in shaping encoder 410 and the constellation used in constellation mapper 450 are designed and configured to be compatible with one another. Some of the parameters that are taken into account to ensure this compatibility include, but are not limited to the use of the same modulation order m and of compatible binary labels for the shaped amplitudes and the corresponding constellation points. An example of such compatibility, for m=3, is described in more detail below in reference to FIGS. 5A-5B.

A bit-word parser 414 operates to parse each bit-word of sequence 412 into shorter bit-words. For example, if the bit-word length in sequence 412 is (m−1) bits, then the (m−1−c) MSBs of each bit word are used to form the corresponding bit-words for a parsed sequence 416, and the remaining LSBs of each bit word are used to form parsed sequences 417 and 418. More specifically, the most significant bit of said LSBs is directed into sequence 417, and the remaining (c−1) LSBs are directed into sequence 418. Here, m denotes the number of bits encoded in each constellation symbol of the constellation used in constellation mapper 450.

Shown in FIG. 4 is an output interface 415 of bit-word parser 414 that pictorially indicates how the bit-words of sequence 412 are being parsed therein. As shown, each bit-word has (m−1) bits denoted as follows:

$$(u_1 u_2 \ldots u_{N_u} L\, l_1 l_2 \ldots l_{Nl}) \qquad (1)$$

where $u_1, u_2, \ldots, u_{Nu}$ denote the $N_u$ MSBs of the bit-word; $L, l_1, l_2, \ldots, l_{Nl}$ denote the $(N_l+1)$ LSBs of the bit-word; L denotes the most significant bit of the $(N_l+1)$ LSBs; and the numbers $N_u$ and $N_l$ are positive integers that satisfy Eq. (2):

$$N_u+N_l+1=m-1 \tag{2}$$

The bit-word $(u_1, u_2, \ldots, u_{Nu})$ is used for sequence 416. The bit L is used for sequence 417. The bit-word $(l_1, l_2, \ldots, l_{Nl})$ is used for sequence 418.

LDPC encoder 420 uses copies of data stream 408 and sequence 418 to form blocks of bits, to which the LDPC encoder applies the operative LDPC code to generate the corresponding blocks of parity bits. The blocks of parity bits are serialized to form a data stream 422.

MUX 440 multiplexes data streams 408 and 422 to generate a corresponding data stream 442. A buffer 430₄ operates to appropriately align in time the data streams 408 and 422 prior to their application to MUX 440. Two copies of data stream 442 are applied to an XOR gate 432 and constellation mapper 450, respectively. XOR gate 432 also receives sequence 417. A buffer 430₁ operates to appropriately align in time the sequence 417 and data stream 442 prior to their application to XOR gate 432. XOR gate 432 applies an XOR operation to each pair of bits from sequence 417 and data stream 442, respectively, thereby generating an output data stream 436, which is then directed to constellation mapper 450. Constellation mapper 450 also receives sequences 416 and 418, which are appropriately buffered in buffers 430₂ and 430₃, respectively, to time-align them with other inputs (e.g., 436, 442) received by the constellation mapper.

The above-indicated time alignments are performed, e.g., to account for different processing delays in different signal-processing paths between DMUX 404 and constellation mapper 450. A person of ordinary skill in the art will understand that the majority of these delays are typically caused by the processing performed in shaping encoder 410 and LDPC encoder 420.

Constellation mapper 450 uses the operative $2m$-PAM constellation to convert sequences 416 and 418 and data streams 436 and 442 into output stream 452, wherein each constellation symbol encodes m bits. Shown in FIG. 4 is an input interface 448 of constellation mapper 450 that pictorially indicates how a bit-word that is being mapped therein is constructed from the various inputs received by the constellation mapper. As shown, each bit-word has m bits denoted as follows:

$$(su_1u_2 \ldots u_{Nu}L'l_1l_2 \ldots l_{Nl}) \tag{3}$$

where s denotes the sign bit of the bit-word; $u_1, u_2, \ldots, u_{Nu}$ denote the $N_u$ MSBs of the bit-word (excluding the sign bit); $L', l_1, l_2, \ldots, l_{Nl}$ denote the $(N_l+1)$ LSBs of the bit-word; and L' denotes the most significant bit of the $(N_l+1)$ LSBs. The sign bit s is provided by the corresponding bit of data stream 436. The bit-word $(u_1, u_2, \ldots, u_{Nu})$ is provided by the corresponding bits of sequence 416. The bit L' is provided by the corresponding bit of data stream 442. The bit-word $(l_1, l_2, \ldots, l_{Nl})$ is provided by the corresponding bits of sequence 418.

Comparison of Eqs. (1) and (3) reveals the bit-word transformation performed by the circuitry located between parser 414 and constellation mapper 450. More specifically, the unsigned amplitude label $(u_1 u_2 \ldots u_{Nu} L' l_1 l_2 \ldots l_{Nl})$ of the bit-word shown in Eq. (3) is obtained by replacing the bit L of the unsigned amplitude label $(u_1 u_2 \ldots u_{Nu} L l_1 l_2 \ldots l_{Nl})$ of Eq. (1) by a respective bit L' from stream 442. The latter bit can be either a parity bit generated by LDPC encoder 420 or an information bit from data stream 408. The sign bit s for the unsigned amplitude label is generated in accordance with Eq. (4):

$$s=L \text{ XOR } L' \tag{4}$$

The signed amplitude label $(s\, u_1\, u_2\, \ldots\, u_{Nu}\, L'\, l_1 l_2\, \ldots\, l_{Nl})$ for constellation mapper 450 is then generated by prepending the signed bit s to the unsigned amplitude label $(u_1 u_2 \ldots u_{Nu} L' l_1 l_2 \ldots l_{Nl})$.

In some embodiments, circuit 400 may be configured to fill the L' bits using only parity bits 422 (for instance, if there is generated a proper sufficient number of such parity bits). In such embodiments, buffer 430₄ and MUX 440 can be removed, and parity stream 422 can be used instead of data stream 442. A person of ordinary skill in the art will understand that the number of parity bits generated by LDPC encoder 420 for stream 422 depends, inter alia, on the rate of the LDPC code used therein and the number $N_l$.

In some embodiments, the number $N_u$ can be zero (i.e., $N_u=0$). In such embodiments, buffer 430₂ can be removed, and sequence 416 may not be generated by bit-word parser 414 and may not be used by constellation mapper 450.

In some embodiments, the number $N_l$ can be zero (i.e., $N_l=0$). In such embodiments, buffer 430₃ can be removed, and sequence 418 may not be generated by bit-word parser 414 and may not be used by LDPC encoder 420 and constellation mapper 450.

FIGS. 5A-5B show example labeling schemes that can be used in circuit 400 according to an embodiment. More specifically, FIG. 5A shows a $2^m$-PAM constellation 500 used in constellation mapper 450, with the corresponding binary labels shown next to each constellation point. FIG. 5B illustrates the relationship between the amplitude labels used in shaping encoder 410 and in constellation 500. In this example, m=3; $N_u=0$; and $N_l=1$.

Referring to FIG. 5A, each binary label in constellation 500 is a three-bit bit-word. According to Eq. (3), the corresponding bit-word format is as follows:

$$(s\, L'\, l_1) \tag{5}$$

Inspection of the binary labels in constellation 500 reveals that the values of the bit L' are anti-symmetric with respect to the origin. In contrast, the values of the bit $l_1$ are symmetric with respect to the origin. As conventional, the values of the sign bit s are anti-symmetric with respect to the origin. A person of ordinary skill in the art will appreciate that these symmetries of the individual bits of the binary labels in constellation 500 can be used to implement an optimal LCM configuration.

A $2^m$-PAM constellation 500' shown in FIG. 5B is the constellation used in shaping encoder 410. According to Eq. (1), the unsigned amplitude labels in constellation 500' have the following format:

$$(L\, l_1) \tag{6}$$

Inspection of the binary labels in constellation 500' reveals that the values of the bit L are symmetric with respect to the origin. The values of the bit $l_1$ are also symmetric with respect to the origin and are the same as in constellation 500 (FIG. 5A). A person of ordinary skill in the art will appreciate that these symmetries of the individual bits of the binary labels in constellation 500' are typical for PAS encoding, wherein the corresponding mapping is implicitly symmetric around the origin, e.g., because no sign bits are generated by a PAS (shaping) encoder.

Note the difference in the symmetries of the two LSBs of the binary labels in constellations 500 and 500', as indicated in FIGS. 5A and 5B.

In effect, XOR gate 432 is used in circuit 400 to convert the labeling of constellation 500' into the labeling of constellation 500, thereby making it optimal for the LCM encoding implemented therein. The two bit strings shown in FIG. 5B below constellation 500' can be used to easily verify that such conversion indeed takes place. The first of those two bit strings shows the values of the bit L' for each constellation point. These values are the same as in FIG. 5A (also see Eq. (5)). The second of those two bit strings shows the values of (s XOR L') for each constellation point (again, see Eq. (5)). It is evident that the values in said second string are the same as the values of the bit L in constellation 500' (also see Eq. (6)), i.e., L=s XOR L'. It can easily be verified that the latter can equivalently be expressed as s=L XOR L', which gives the explicit formula for the sign bit s.

Figure 6:
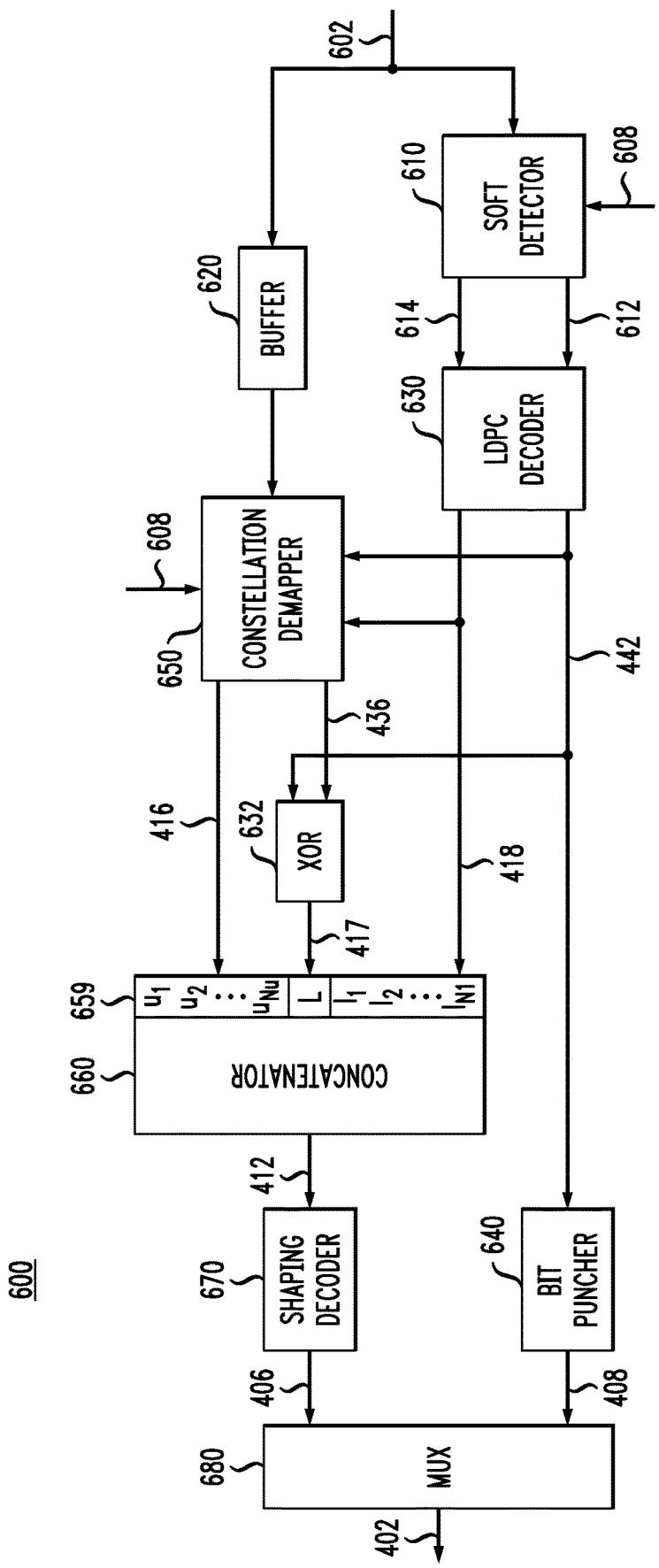
FIG. 6 shows a block diagram of a digital circuit that can be used in the receiver of FIG. 3 according to an embodiment.

FIG. 6 shows a block diagram of a digital circuit 600 that can be used in receiver 300 (FIG. 3) according to an embodiment. More specifically, circuit 600 can be a part of electronic decoder 340. In some embodiments, electronic decoder 340 may include two or more instances (nominal copies) of circuit 600 connected in parallel with one another.

Circuit 600 operates to recover data stream 402 (also see FIG. 4) in response to receiving a corresponding input stream 602 of digital samples (values) from a carrier demapper of electronic decoder 340. In an example embodiment, the carrier demapper generates input stream 602 by appropriately transferring thereto digital samples from one or more sequences $332_1$-$332_K$ generated by FFT module 330 of the corresponding receiver 300, e.g., as described above in reference to FIG. 3.

Circuit 600 includes a soft information detector 610 configured to calculate log-likelihood ratios (LLRs) corresponding to the bits encoded by LDPC encoder 420. This calculation can be performed as known in the pertinent art, e.g., using prior information 608 of the corresponding amplitude distributions. The LLRs corresponding to the L' bits are directed to an LDPC decoder 630 by way of an LLR stream 612. The LLRs corresponding to the encoded LSBs ($l_1, l_2, \ldots, l_{NI}$) are similarly directed to LDPC decoder 630 by way of an LLR stream 614.

LDPC decoder 630 operates to process the LLRs provided by LLR streams 612 and 614 to recover the corresponding codewords of the LDPC code used by LDPC encoder 420. The bits representing the L' bits are then extracted from each recovered LDPC codeword to reconstruct data stream 442. The bits representing the encoded LSBs ($l_1, l_2, \ldots, l_{NI}$) are also extracted from each recovered LDPC codeword to reconstruct sequence 418 (also see FIG. 4).

A bit puncher 640 operates to discard (punch out) from data stream 442 the bits corresponding to parity bit stream 422, thereby reconstructing data stream 408.

A constellation demapper 650 uses a delayed copy of input stream 602 and copies of data stream 442 and sequence 418 to reconstruct sequence 416 and data stream 436 (also see FIG. 4). In some embodiments, the demapping performed by constellation demapper 650 may rely on some or all of prior information 608. A buffer 620 is configured to delay input stream 602 to account for the processing delay introduced by soft information detector 610 and LDPC decoder 630 such that, in each time slot, the bits provided to constellation demapper 650 by data stream 442 and sequence 418 originate from the digital sample provided by input stream 602.

In an example embodiment, constellation demapper 650 can be configured to implement an LCM demapping procedure described in the above-cited U.S. Pat. No. 10,091,046.

An XOR gate 632 applies an XOR operation to each pair of bits received by way of sequence 418 and data stream 442, respectively, thereby recovering sequence 417.

A concatenator 660 uses the recovered sequences 416, 417, and 418 to reconstruct sequence 412. A person of ordinary skill in the art will understand that the operation performed by concatenator 660 is inverse to the operation performed by parser 414 (FIG. 4). The latter fact is also apparent from comparison of interfaces 415 (FIG. 4) and 659 (FIG. 6).

A shaping decoder 670 operates, using the same shaping code used in shaping encoder 410, to convert bit-word sequence 412 back into data stream 406.

A MUX 680 operates to properly multiplex the recovered data streams 406 and 408 to recover data stream 402. A person of ordinary skill in the art will understand that the operation performed by MUX 680 is inverse to the operation performed by DMUX 404 (FIG. 4).

It should be noted that, due to the XOR-ing in a (receiver) circuit 600 of the decoded L' and s bits to obtain the L bits, errors from the LDPC-protected L' bits might propagate to the L bits. This implies that errors in the LDPC parity bits (422, FIG. 4; carried by the L' bits) will lead to errors in the decoded L bit values, and thus to errors in the decoded unsigned amplitude values. The latter errors will further lead to decoding errors in shaping decoder 670. This error-propagation behavior (wherein errors in the LDPC parity propagate to the amplitudes) is a distinct characteristic of the coding scheme implemented using circuits 400 and 600. For example, such error propagation does not happen in "pure" LCM (without shaping) or in a PAS-LCM scheme in which parity is placed in the sign bits, e.g., because, in the latter two schemes, the parity is simply discarded after the hard demapping.

Many LDPC codes that are used in practice offer less protection for the parity bits, as their structure is typically such that the average degree of the parity bits is lower than the average degree of the information bits (which are encoded). As used herein, the term "degree of a bit" refers to the number of constraints the bit is subjected to by the LDPC code. As a consequence, at a low codeword error rate, erroneous received codewords may have errors only in parity bits. Such erroneous codewords may not lead to decoding errors in some conventional coding schemes, as the erroneous parity bits are simply discarded. However, in the coding scheme implemented using circuits 400 and 600, such erroneous codewords may lead to error propagation to the amplitude bits (e.g., to the L bit).

Fortunately, such error propagation can be prevented in circuit 600 in a relatively straightforward manner, e.g., by configuring LDPC decoder 630 to apply an additional post-processing step, in which the decoded information bits are re-encoded using the operative LDPC code. The parity generated in this manner, rather than the decoded parity, may then be outputted by LDPC decoder 630 together with the decoded information bits to prevent the above-indicated error propagation. This post-processing step is optional and does not need to be used in all embodiments or applied to generate all parity bits. This post-processing step can also be used to generate only a part of the parity bits (e.g., the parity bits with a degree below a certain threshold).

In an alternative embodiment, this post-processing step can be implemented using a separate dedicated circuit component (not explicitly shown in FIG. 6). Said dedicated circuit component may be inserted, e.g., upstream from XOR gate 632.

Figure 7:
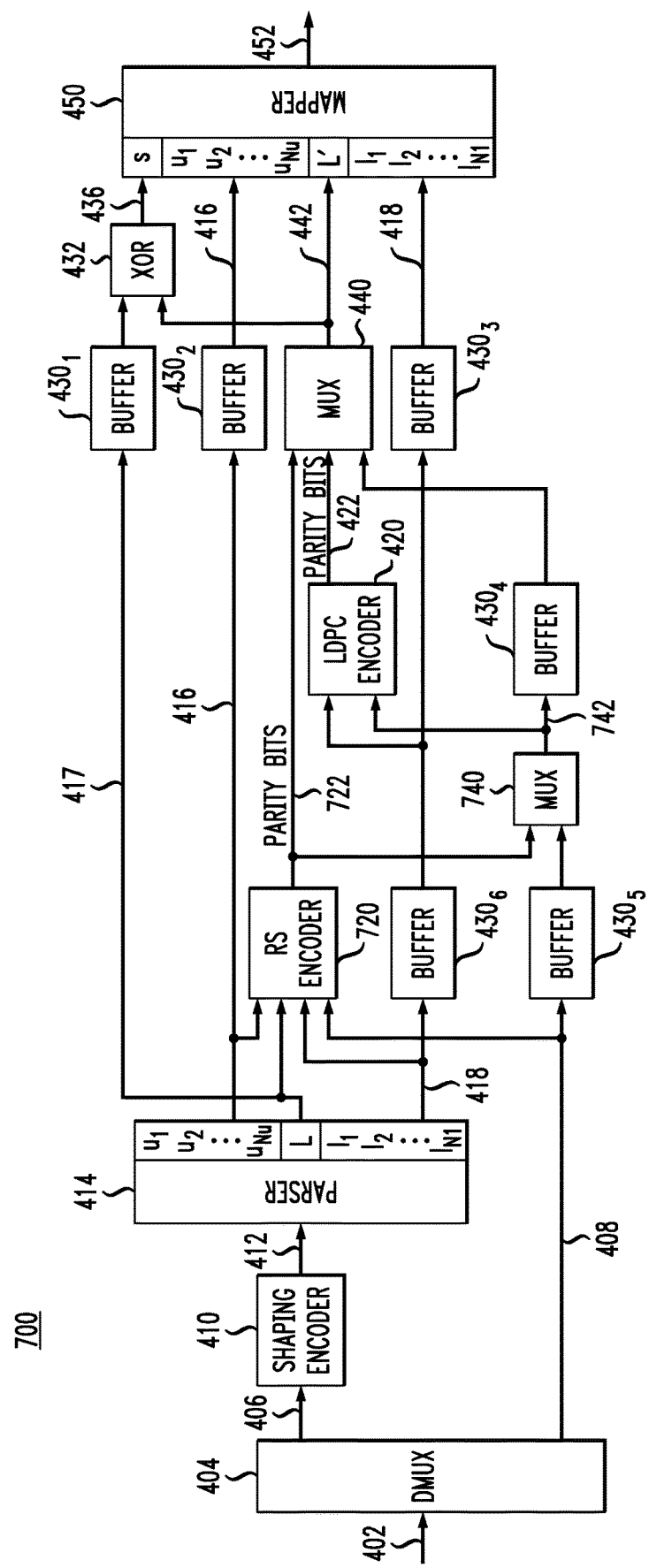
FIG. 7 shows a block diagram of a digital circuit that can be used in the transmitter of FIG. 2 according to another embodiment.

FIG. 7 shows a block diagram of a digital circuit 700 that can be used in transmitter 200 (FIG. 2) according to another embodiment. Circuit 700 is a modification of circuit 400 (FIG. 4) in which an additional (outer) layer of FEC coding is used to protect sequences 416, 417, and 418 and data stream 408, or a subset thereof. In the example shown in FIG. 7, the outer layer of FEC coding is implemented using a Reed-Solomon (RS) code. A person of ordinary skill in the art will understand that other implementations of the outer layer of FEC coding may use other suitable FEC codes.

The additional circuitry incorporated into circuit 700 (as compared with circuit 400, FIG. 4) includes an RS encoder 720, buffers $430_5$ and $430_6$, and a MUX 740. RS encoder 720 operates to generate a parity bit stream 722 by applying the operative RS code to blocks of bits formed using copies of sequences 416, 417, and 418 and data stream 408 (or a subset thereof). Bit stream 722 and data stream 408 are then multiplexed using MUX 740 to generate a corresponding data stream 742. A copy of data stream 742 is applied to LDPC encoder 420 instead of the copy of data stream 408 (see FIG. 4). The time delays imposed by buffers $430_1$-$430_6$ are appropriately selected to account for different processing delays in different signal-processing paths between DMUX 404 and constellation mapper 450.

In an example implementation, the code rate of the RS code used in RS encoder 720 can be higher than the code rate of the LDPC code used in LDPC encoder 420. The same RS code can advantageously be used at the corresponding receiver (see, e.g., FIG. 8) to correct errors (if any) in the decoded sequences 416, 417, and 418 and data stream 408. These errors can be caused, e.g., by the non-stationary noise induced by narrowband RF interference on some tones.

Figure 8:
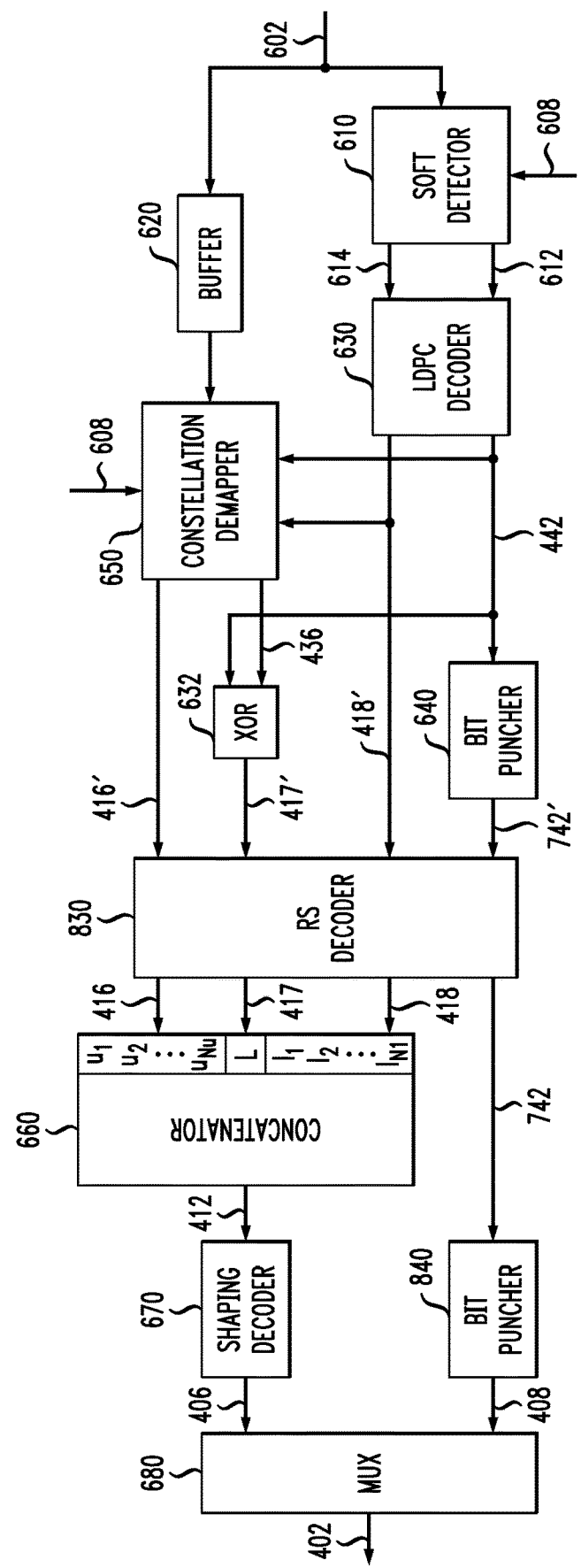
FIG. 8 shows a block diagram of a digital circuit that can be used in the receiver of FIG. 3 according to another embodiment.

FIG. 8 shows a block diagram of a digital circuit 800 that can be used in receiver 300 (FIG. 3) according to an alternative embodiment. More specifically, circuit 800 is a modification of circuit 600 (FIG. 6), with the modifications being directed at making the decoding processing implemented in circuit 800 compatible with the encoding processing implemented in circuit 700 (FIG. 7).

The additional circuitry incorporated into circuit 800 (as compared with circuit 600, FIG. 6) includes an RS decoder 830 and a bit puncher 840. The inputs to RS decoder 830 are labeled using the "primed" reference numerals to indicate that the corresponding data sequences/streams may have errors in them, which errors can be corrected by the RS decoder. Bit puncher 840 operates to discard from the recovered data stream 742 the bits corresponding parity bit stream 722, thereby reconstructing data stream 408.

A person of ordinary skill in the art will understand, without any undue experimentation, how to modify circuit 800 to make it compatible with any one of the above-indicated alternative embodiments of circuit 700.

Figure 9:
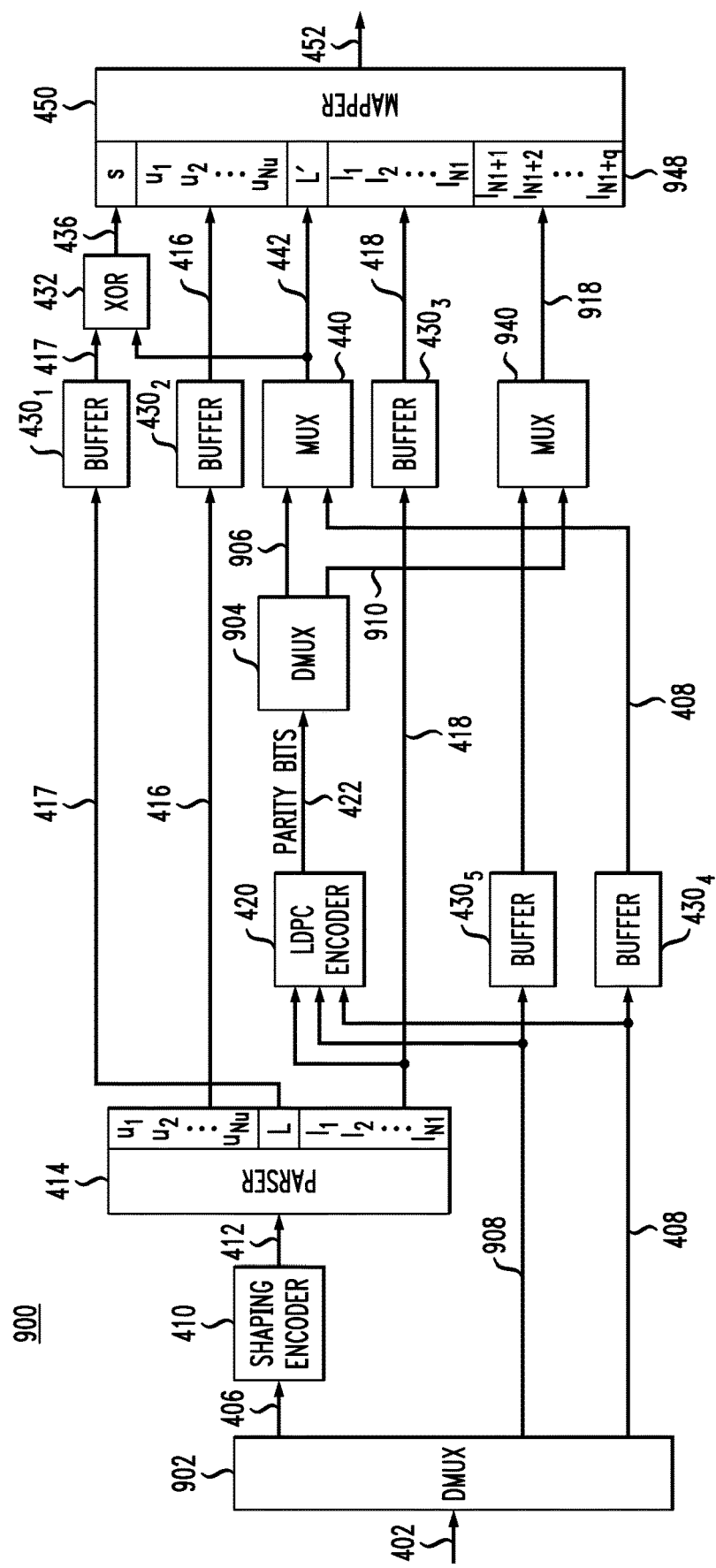
FIG. 9 shows a block diagram of a digital circuit that can be used in the transmitter of FIG. 2 according to yet another embodiment.

FIG. 9 shows a block diagram of a digital circuit 900 that can be used in transmitter 200 (FIG. 2) according to yet another embodiment. Circuit 900 is another modification of circuit 400 (FIG. 4) in which some LSBs of the transmitted constellation symbols are left unshaped by (e.g., are not generated using) shaping encoder 410.

The additional circuitry incorporated into circuit 900 (as compared with circuit 400, FIG. 4) includes a 3-way DMUX 902, a buffer $430_5$, a DMUX 904, and a MUX 940. The 3-way DMUX 902 replaces DMUX 404 (see FIG. 4) and is configured to generate data streams 406, 408, and 908 by demultiplexing input data stream 402. LDPC decoder 420 is modified to generate parity bit stream 422 based on three inputs instead of two, the additional input being a copy of data stream 908. Constellation mapper 450 has a modified input interface 948 that enables generation of input bit-words based on five inputs instead of four, the additional input being a data stream 918 (also see FIG. 4). As shown, each bit-word formed by input interface 948 has the following structure:

$$(su_1 u_2 \ldots u_{N_u} L' l_1 l_2 \ldots l_{Nl} l_{Nl+1} l_{Nl+2} \ldots 1_{Nl+q}) \quad (7)$$

where s denotes the sign bit of the bit-word; $u_1, u_2, \ldots, u_{N_u}$ denote the $N_u$ MSBs of the bit-word (excluding the sign bit); $L', l_1, l_2, \ldots, l_{Nl}, \ldots, 1_{Nl+q}$ denote the $(N_l+1+q)$ LSBs of the bit-word; L' denotes the most significant bit of the $(N_l+1+q)$ LSBs; and q is a positive integer; and the numbers q, $N_u$ and $N_l$ are positive integers that satisfy Eq. (8):

$$N_u + N_l + q + 2 = m \quad (8)$$

The sign bit s is provided by the corresponding bit of data stream 436. The bit-word $(u_1, u_2, \ldots, u_{N_u})$ is provided by the corresponding bits of sequence 416. The bit L' is provided by the corresponding bit of data stream 442. The bit-word $(l_1, l_2, \ldots, l_{Nl})$ is provided by the corresponding bits of sequence 418. The bit-word $(1_{Nl+1}\ 1_{Nl+2}\ \ldots\ 1_{Nl+q})$ is provided by the corresponding bits of data stream 918.

DMUX 904 is configured to branch off a portion 910 of parity data stream 422. The remaining portion 906 of parity data stream 422 is channeled by DMUX 904, by way of MUX 440, into data stream 442. MUX 940 is configured to generate data stream 918 by multiplexing data streams 908 and 910.

The time delays imposed by buffers $430_1$-$430_5$ are appropriately selected to account for different processing delays in different signal-processing paths between DMUX 902 and constellation mapper 450.

In this embodiment, the bits $(1_{Nl+1}\ 1_{Nl+2}\ \ldots\ 1_{Nl+q})$ of each binary label of the operative constellation are not shaped by shaping encoder 410, but are nevertheless protected by the operative LDPC code used in LDPC encoder 420.

In some embodiments, circuit 900 can be modified such that LDPC encoder 420 is removed, and the parity bit stream 422 is neither generated nor transmitted. In such embodiments, data stream 408 is used instead of data stream 442, and data stream 908 is used instead of data stream 918 (e.g., see FIG. 10).

In some embodiments, the numbers $N_l$ and q can be set to $N_l=0$ and q=1. In such embodiments, DMUX 904 an MUX 940 can be removed.

Figure 10:
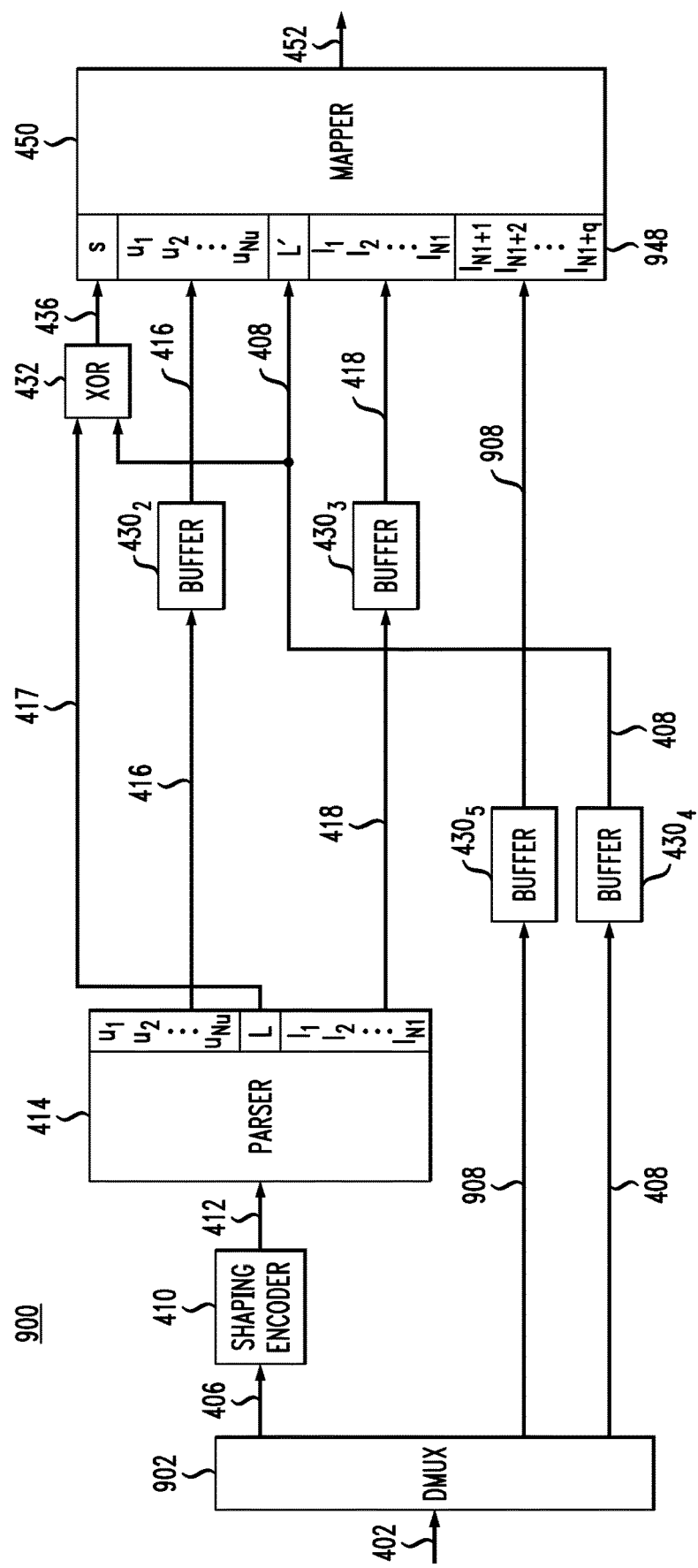
FIG. 10 explicitly shows a block diagram of the digital circuit of FIG. 9 according to an alternative embodiment.

FIG. 10 explicitly shows a block diagram of digital circuit 900 according to an alternative embodiment, in which LDPC encoder 420 is absent (as indicated in the preceding paragraph). An important characteristic of this particular embodiment is the realization of anti-symmetric labeling (explained in reference to FIGS. 5A-5B) for the transmission of at least one of the shaped amplitude bits (e.g., L) without affecting the symmetric labeling inherent to the PAS coding (e.g., see 500', FIG. 5A). This particular embodiment of digital circuit 900 also demonstrates that placing parity into such anti-symmetric amplitude bits (e.g., L') can be optional, as FEC parity is not being generated therein.

Figure 11:
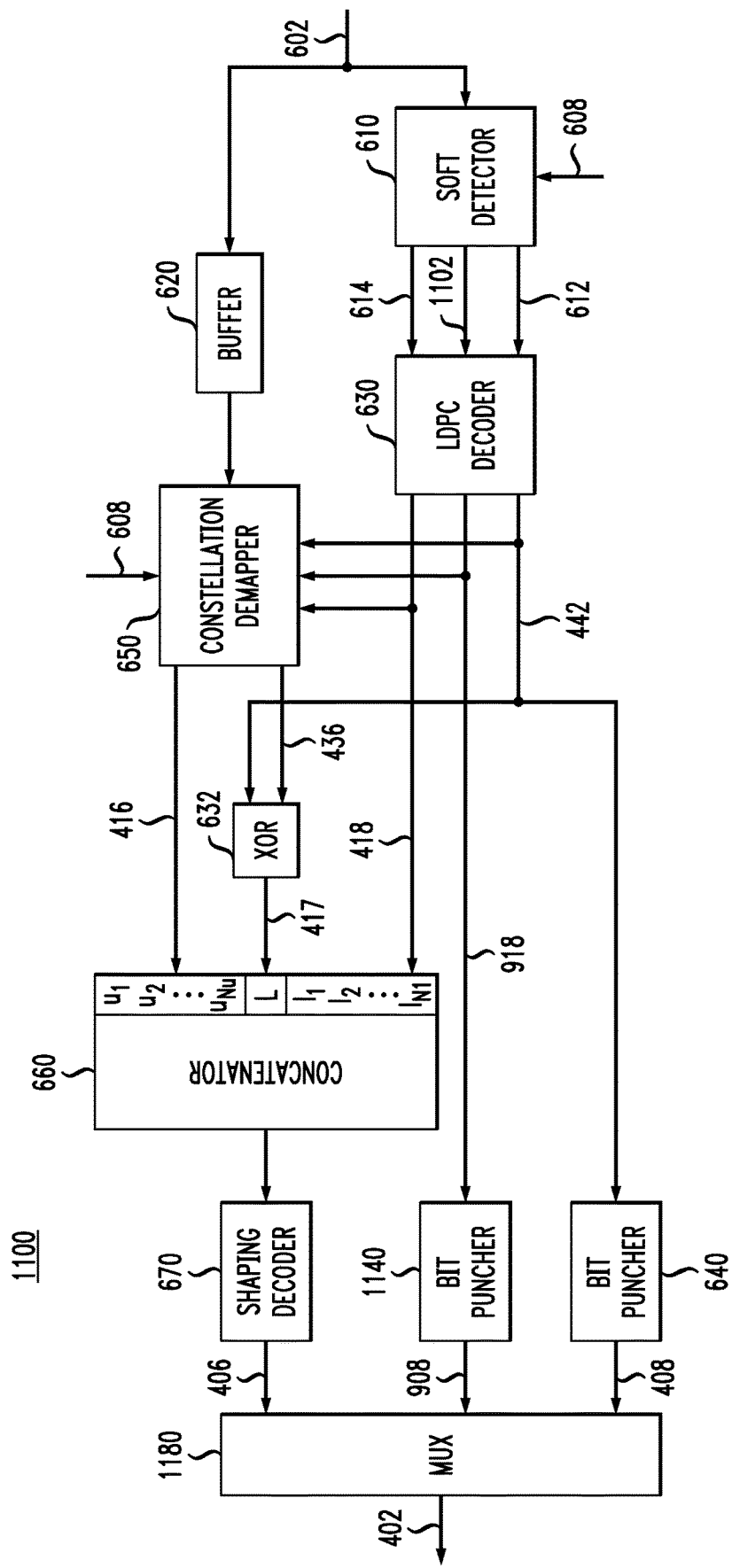
FIG. 11 shows a block diagram of a digital circuit that can be used in the receiver of FIG. 3 according to yet another embodiment.

FIG. 11 shows a block diagram of a digital circuit 1100 that can be used in receiver 300 (FIG. 3) according to yet another embodiment. More specifically, circuit 1100 can be a part of electronic decoder 340. Circuit 1100 is a modification of circuit 600 (FIG. 6), with the modifications being directed at making the decoding processing implemented in circuit 1100 compatible with the encoding processing implemented in circuit 900 (FIG. 9).

The additional circuitry incorporated into circuit 1100 (as compared with circuit 600, FIG. 6) includes a bit puncher

1140. A three-input MUX 1180 replaces MUX 680 (see FIG. 6). Soft detector 610 is modified to generate an additional LLR stream, which is labeled 1102, said additional LLR stream carrying the LLRs corresponding to the LSBs ($l_{Nl+1}$ $l_{Nl+2}$ . . . $l_{Nl+q}$). LDPC decoder 630 is modified to additionally output data stream 918 (also see FIG. 9). Constellation demapper is modified to recover sequences 416, 417, and 418 based on data streams 418, 918, and 442 received from LDPC decoder 630. Bit puncher 1140 operates to discard from said data stream 918 the bits corresponding to bit stream 910, thereby reconstructing data stream 908 (also see FIG. 9). MUX 1180 operates to properly multiplex the received data streams 406, 908, and 408 to recover data stream 402. A person of ordinary skill in the art will understand that the operation performed by MUX 1180 is inverse to the operation performed by DMUX 902 (FIG. 9).

Figure 12:
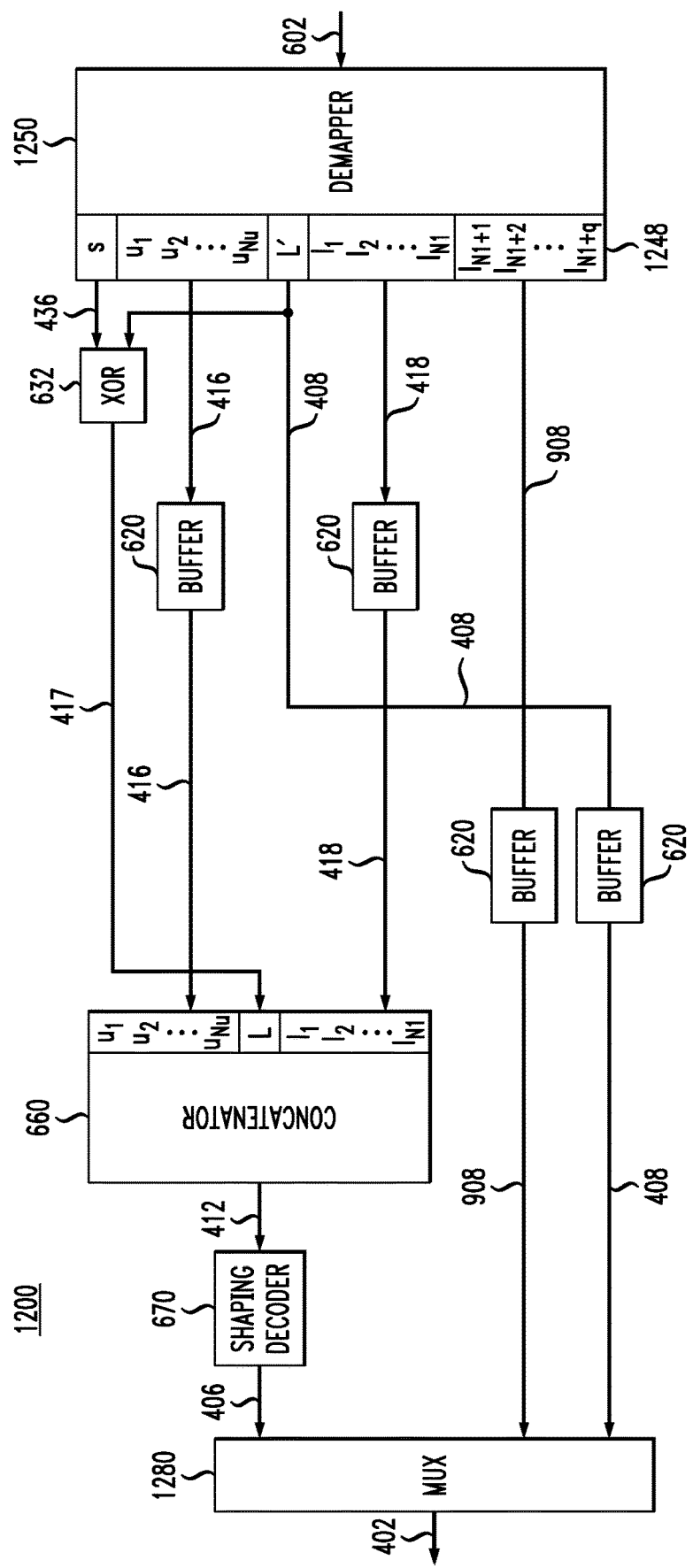
FIG. 12 shows a block diagram of a digital circuit that can be used in the receiver of FIG. 3 according to yet another embodiment.

FIG. 12 shows a block diagram of a digital circuit 1200 that can be used in receiver 300 (FIG. 3) according to yet another embodiment. More specifically, circuit 1200 can be a part of electronic decoder 340 and is configured to perform the decoding processing that is compatible with the encoding processing implemented in the embodiment of circuit 900 shown in FIG. 10.

Circuit 1200 comprises a constellation demapper 1250 that maps digital samples of input stream 602 onto the operative constellation to determine the corresponding binary label. An output interface 1248 then appropriately parses the determined binary labels to recover data streams/sequences 436, 416, 408, 418, and 908. XOR gate 632 recovers sequence 417 by applying an XOR operation to each pair of bits provided by data streams 436 and 408. Concatenator 660 then reconstructs sequence 412 using sequences 416, 417, and 418. Shaping decoder 670 operates to convert bit-word sequence 412 back into data stream 406.

The time delays imposed by buffers 620 are appropriately selected to account for different processing delays in different signal-processing paths between constellation demapper 1250 and a MUX 1280. MUX 1180 operates to multiplex the received data streams 406, 908, and 408 to recover data stream 402.

Figure 13:
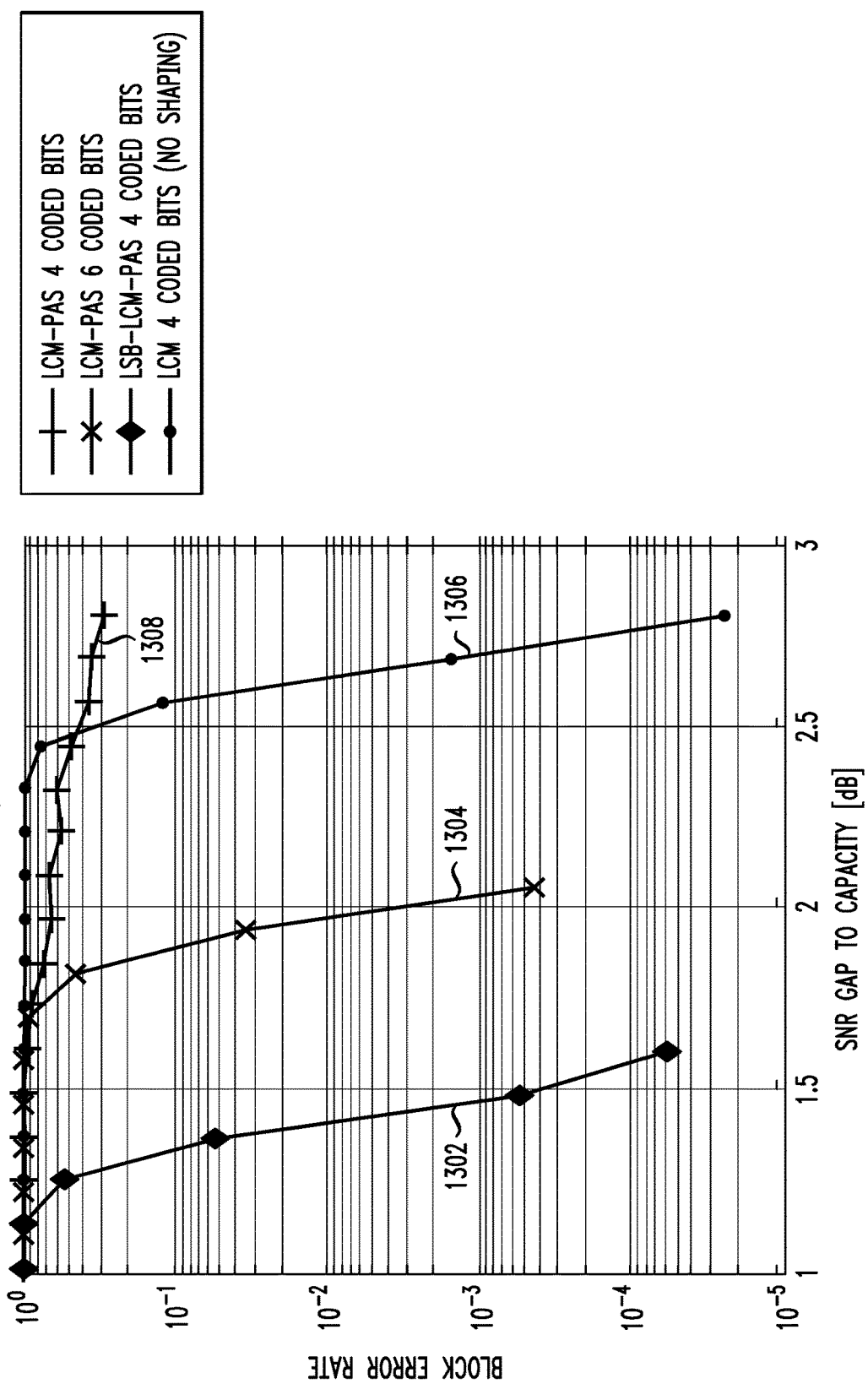
FIG. 13 graphically compares certain performance characteristics of several coding schemes.

FIG. 13 graphically compares certain performance characteristics of several LCM schemes. To obtain the shown performance data, we used, for all of these schemes, a 12000-bit long LDPC code with a code rate 3/4, i.e., a code that generates one parity bit for every three information bits. The simulated block error rates of the different schemes are shown as a function of the SNR gap to capacity, which is defined as:

$$\text{SNR gap to capacity [dB]} = \text{SNR[dB]} - 10 \log_{10}(2^{b\_\text{eff}} - 1) \quad (9)$$

where b_eff is the effective amount of information that is being transmitted (i.e., with the coding and shaping overhead subtracted). The SNR gap to capacity allows comparing different schemes that transmit different respective amounts of effective information b_eff.

Curve 1302 graphically shows the simulated block error rate (for a block of 15000 bits) of the disclosed LSB-only LCM-PAS scheme with four coded bits per $2^8$-QAM symbol (i.e., with two coded bits per 16-PAM symbol). The corresponding encoding at the transmitter can be performed, e.g., using circuit 400 (FIG. 4).

An LCM scheme without shaping and with four coded bits (curve 1306) leads to a gap to capacity of about 2.77 dB at a block error rate of $10^{-4}$, which is a typical operating point for DSL. By applying the shaping encoding based on the LCM-PAS with six coded bits (curve 1304), one can reduce the gap to about 2.1 dB (a gain of about 0.67 dB). The gain is limited compared to the potential shaping gain of 1.53 dB, because of the higher number of coded bits (i.e., six instead of four). For all practical purposes, one cannot use the LCM-PAS scheme with only four coded bits (curve 1308), because then the uncoded bits do not have sufficient protection, leading to an unacceptably high block error rate. In contrast, with the LSB-only LCM-PAS scheme represented by curve 1302, one can use four coded bits while still being able to obtain sufficient protection for the uncoded bits, leading to a gap to capacity of ~1.58 dB, which is a shaping gain of ~1.19 dB.

A possible benefit of the disclosed LSB s-only PAS-LCM technique is that one can apply the LDPC code to the lowest LSBs only, which are the bits that need the protection the most (because they are the least reliable). In contrast, under the comparable PAS-LCM technique, the corresponding encoder is also configured to protect sign bits, even though the sign bits are the most reliable (and hence may not need the protection). As a consequence, the LSB s-only scheme can be more efficient in terms of the information throughput and complexity, with the corresponding improvements being indicated by the relative position of curve 1302. Note that some embodiments may be applied not only to LCM but to any suitable layered coded modulation scheme. For example, it can be used with Trellis-coded modulation, such as that used in legacy DSL.

Note also that some embodiments can be used in multi-carrier communication, such as DSL, in which the FEC codewords run over different tones that can possibly use different shaping codes and/or different modulation orders.

According to an example embodiment disclosed above, e.g., in the summary section and/or in reference to any one or any combination of some or all of FIGS. 1-13, provided is an apparatus comprising a data transmitter (e.g., 200, FIG. 2) that comprises an electrical analog front (e.g., 240, FIG. 2) end and a digital signal processor (e.g., 204, FIG. 2), the digital signal processor being configured to: redundancy-encode an input data stream (e.g., 202, FIG. 2; 402, FIGS. 4, 7, 9, 10) to generate a constellation-symbol stream (e.g., 452, FIGS. 4, 7, 9, 10); and drive the analog front end to cause one or more modulated electrical carriers generated by the analog front end to carry constellation symbols of the constellation-symbol stream; and wherein the digital signal processor comprises: a demultiplexer (e.g., 404, FIGS. 4, 7; 902, FIGS. 9, 10) configured to demultiplex the input data stream to generate a first sub-stream (e.g., 406, FIGS. 4, 7, 9, 10) and a second sub-stream (e.g., 408, FIGS. 4, 7, 9, 10; 908, FIGS. 9, 10); a shaping encoder (e.g., 410, FIGS. 4, 7, 9, 10) configured to generate a first encoded data stream (e.g., 417, FIGS. 4, 7, 9, 10) and a second encoded data stream (e.g., 416, FIGS. 4, 7, 9, 10) by applying a shaping code to the first sub-stream; and a constellation mapper (e.g., 450, FIGS. 4, 7, 9, 10) configured to: use the second encoded data stream to select constellation-symbol amplitudes for the constellation-symbol stream; and use the first encoded data stream and the second sub-stream to select at least some signs (e.g., s, FIGS. 4, 7, 9, 10) applied to the constellation-symbol amplitudes.

In some embodiments of the above apparatus, the digital signal processor further comprises a logic gate (e.g., 432, FIGS. 4, 7, 9, 10) having first and second inputs and an output, the first input being connected to receive the first encoded data stream, the second input being connected to receive a data stream (e.g., 408, FIG. 10; 442, FIGS. 4, 7, 9) corresponding to the second sub-stream, the output being connected to the constellation mapper; and wherein the constellation mapper is configured to use bit values (e.g., 436, FIGS. 4, 7, 9, 10) received from the output to select the signs applied to the constellation-symbol amplitudes.

In some embodiments of any of the above apparatus, the logic gate comprises an XOR gate (e.g., 432, FIGS. 4, 7, 9, 10).

In some embodiments of any of the above apparatus, the apparatus further comprises an FEC encoder (e.g., 420, FIGS. 4, 7, 9) configured to generate a third encoded data stream (e.g., 422, FIGS. 4, 7, 9) by applying an FEC code to the second sub-stream; and wherein the constellation mapper is further configured to use the third encoded data stream (e.g., by way of 442, FIGS. 4, 7, 9; and/or 918, FIG. 9) to select the constellation-symbol amplitudes for the constellation-symbol stream.

In some embodiments of any of the above apparatus, the FEC encoder (e.g., 420, FIGS. 4, 7, 9) is configured to use a low-density parity-check (LDPC) code.

In some embodiments of any of the above apparatus, the shaping encoder is further configured to generate a fourth encoded data stream (e.g., 418, FIGS. 4, 7, 9) by applying the shaping code to the first sub-stream; and wherein the FEC encoder is further configured to generate the third encoded data stream by also applying the FEC code to the fourth encoded data stream.

In some embodiments of any of the above apparatus, the demultiplexer is further configured to demultiplex the input data stream to generate a third sub-stream (e.g., 408 or 908, FIG. 9); and wherein the FEC encoder is further configured to generate the third encoded data stream by also applying the FEC code to the third sub-stream.

In some embodiments of any of the above apparatus, the constellation mapper is further configured to use the third encoded data stream (e.g., by way of 442, FIGS. 4, 7, 9) to select at least some of the signs applied to the constellation-symbol amplitudes.

In some embodiments of any of the above apparatus, the apparatus further comprises an FEC encoder (e.g., 420, FIGS. 4, 7, 9) configured to generate a third encoded data stream (e.g., 422, FIGS. 4, 7, 9) by applying an FEC code to the second sub-stream; and wherein the constellation mapper is further configured to use the third encoded data stream (e.g., by way of 442, FIGS. 4, 7, 9) to select at least some of the signs applied to the constellation-symbol amplitudes.

In some embodiments of any of the above apparatus, the constellation mapper is configured to select a constellation-symbol amplitude using a bit-word (e.g., $(u_1 u_2 \ldots u_{N_u} L')$, Eq. (7)) having a fixed number (e.g., $N_u$, FIG. 10) of bits supplied by the second encoded data stream and a single bit (e.g., L', FIG. 10) supplied by the second sub-stream.

In some embodiments of any of the above apparatus, the constellation mapper is configured to perform constellation mapping using a set of binary labels in which different binary labels correspond to different respective constellation symbols (e.g., 500, FIG. 5A), each binary label (e.g., (s L' $l_1$), Eq. (5)) including a respective sign portion (e.g., s, Eq. (5)) and a respective amplitude portion (e.g., (L' $l_1$), Eq. (5)); and wherein the amplitude portion is such that, for any pair of constellation symbols that are symmetric with respect to a constellation origin, respective values of a particular bit of the amplitude portion include a binary zero and a binary one (e.g., L', FIG. 5A).

In some embodiments of any of the above apparatus, the digital signal processor further comprises a carrier mapper (e.g., 210, FIG. 2) configured to generate a plurality of constellation-symbol sub-streams (e.g., 212, FIG. 2) by partitioning the constellation-symbol stream; and wherein the digital signal processor is configured to drive the analog front end to cause a plurality of the modulated electrical carriers generated by the analog front end to carry the plurality of said constellation-symbol sub-streams.

In some embodiments of any of the above apparatus, the apparatus further comprises a modem (e.g., 150, FIG. 1), the modem including the data transmitter.

In some embodiments of any of the above apparatus, the apparatus further comprises a service distribution unit (e.g., 110, FIG. 1), the service distribution unit including the data transmitter.

According to another example embodiment disclosed above, e.g., in the summary section and/or in reference to any one or any combination of some or all of FIGS. 1-13, provided is an apparatus comprising a data receiver (e.g., 300, FIG. 3) that comprises an electrical analog front end (e.g., 310, FIG. 3) and a digital signal processor (e.g., 324, FIG. 3), the digital signal processor being configured to process a stream of values (e.g., 602, FIG. 6) representing one or more modulated carriers of a received electrical signal outputted by the electrical analog front end and corresponding to a stream of transmitted constellation symbols of a constellation (e.g., 500, FIG. 5A), the digital signal processor being configured to redundancy-decode the stream of values to recover a source data stream (e.g., 402, FIG. 6) redundancy-encoded in the stream of transmitted constellation symbols and carried by the one or more modulated electrical carriers; and wherein the digital signal processor comprises: a constellation demapper (e.g., 650, FIG. 6; 1250, FIG. 12) configured to generate a first data stream (e.g., 436, FIGS. 6, 12) and a second data stream (e.g., 416, FIGS. 6, 12) by mapping each of the stream of values onto the constellation, the first data stream carrying sign bits of binary labels of constellation symbols determined by the mapping, the second stream carrying amplitude bits of the binary labels of the constellation symbols determined by the mapping; and a shaping decoder (e.g., 670, FIG. 6) configured to recover a first sub-stream (e.g., 406, FIG. 6) of the source data stream by decoding a stream (e.g., 412, FIG. 6) of bit-words (e.g., $(u_1 u_2 \ldots u_{N_u} L l_1 l_2 \ldots l_{N_l})$, Eq. (1); 659, FIG. 6) generated using the first and second data streams, the decoding being performed using a shaping code.

In some embodiments of the above apparatus, the digital signal processor further comprises a logic gate (e.g., 632, FIG. 6) having first and second inputs and an output, the first input being connected to receive the first data stream, the second input being connected to receive a third data stream (e.g., 442, FIG. 6; 408, FIG. 12), the third data stream being generated based on the stream of values; and wherein the stream of bit-words includes bit values (e.g., 417, FIG. 6) generated at the output of the logic gate.

In some embodiments of any of the above apparatus, the logic gate comprises an XOR gate (e.g., 632, FIG. 6).

In some embodiments of any of the above apparatus, the apparatus further comprises an FEC decoder (e.g., 610/630, FIG. 6) configured to recover a second sub-stream (e.g., 408, FIG. 6) of the source data stream by applying an FEC code to decode the stream of values; and wherein the constellation demapper is further configured to use an output (e.g., 442, 418, FIG. 6) of the FEC decoder to perform the mapping.

In some embodiments of any of the above apparatus, the FEC decoder (e.g., 630, FIG. 6) is configured to use a low-density parity-check (LDPC) code.

In some embodiments of any of the above apparatus, the FEC decoder is configured to: discard parity bits recovered by decoding the stream of values; regenerate the parity bits by re-encoding information bits recovered by decoding the stream of values; and direct the regenerated parity bits to the constellation demapper.

In some embodiments of any of the above apparatus, the digital signal processor further comprises a logic gate (e.g., 632, FIG. 6) having first and second inputs and an output, the first input being connected to receive the first data stream, the second input being connected to receive a third data stream (e.g., 442, FIG. 6), the third data stream being generated by the FEC decoder by decoding the stream of values; and wherein the stream of bit-words includes bit values (e.g., 417, FIG. 6) generated at the output of the logic gate.

In some embodiments of any of the above apparatus, the apparatus further comprises a modem (e.g., 150, FIG. 1), the modem including the data receiver.

In some embodiments of any of the above apparatus, the apparatus further comprises a service distribution unit (e.g., 110, FIG. 1), the service distribution unit including the data receiver.

While this disclosure includes references to illustrative embodiments, this specification is not intended to be construed in a limiting sense. Various modifications of the described embodiments, as well as other embodiments within the scope of the disclosure, which are apparent to persons skilled in the art to which the disclosure pertains are deemed to lie within the principle and scope of the disclosure, e.g., as expressed in the following claims.

Some embodiments may be implemented as circuit-based processes, including possible implementation on a single integrated circuit.

Some embodiments can be embodied in the form of methods and apparatuses for practicing those methods. Some embodiments can also be embodied in the form of program code recorded in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the patented invention(s). Some embodiments can also be embodied in the form of program code, for example, stored in a non-transitory machine-readable storage medium including being loaded into and/or executed by a machine, wherein, when the program code is loaded into and executed by a machine, such as a computer or a processor, the machine becomes an apparatus for practicing the patented invention(s). When implemented on a general-purpose processor, the program code segments combine with the processor to provide a unique device that operates analogously to specific logic circuits.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain the nature of this disclosure may be made by those skilled in the art without departing from the scope of the disclosure, e.g., as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

Unless otherwise specified herein, the use of the ordinal adjectives "first," "second," "third," etc., to refer to an object of a plurality of like objects merely indicates that different instances of such like objects are being referred to, and is not intended to imply that the like objects so referred-to have to be in a corresponding order or sequence, either temporally, spatially, in ranking, or in any other manner.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

As used herein in reference to an element and a standard, the term compatible means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they formally fall within the scope of the claims.

The described embodiments are to be considered in all respects as only illustrative and not restrictive. In particular, the scope of the disclosure is indicated by the appended claims rather than by the description and figures herein. All changes that come within the meaning and range of equivalency of the claims are to be embraced within their scope.

A person of ordinary skill in the art would readily recognize that steps of various above-described methods can be performed by programmed computers. Herein, some embodiments are intended to cover program storage devices, e.g., digital data storage media, which are machine or computer readable and encode machine-executable or computer-executable programs of instructions where said instructions perform some or all of the steps of methods described herein. The program storage devices may be, e.g., digital memories, magnetic storage media such as a magnetic disks or tapes, hard drives, or optically readable digital data storage media. The embodiments are also intended to cover computers programmed to perform said steps of methods described herein.

The description and drawings merely illustrate the principles of the disclosure. It will thus be appreciated that those of ordinary skill in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

The functions of the various elements shown in the figures, including any functional blocks labeled as "processors" and/or "controllers," may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

As used in this application, the term "circuitry" may refer to one or more or all of the following: (a) hardware-only circuit implementations (such as implementations in only analog and/or digital circuitry); (b) combinations of hardware circuits and software, such as (as applicable): (i) a combination of analog and/or digital hardware circuit(s) with software/firmware and (ii) any portions of hardware processor(s) with software (including digital signal processor(s)), software, and memory(ies) that work together to cause an apparatus, such as a mobile phone or server, to perform various functions); and (c) hardware circuit(s) and or processor(s), such as a microprocessor(s) or a portion of a microprocessor(s), that requires software (e.g., firmware) for operation, but the software may not be present when it is not needed for operation." This definition of circuitry applies to all uses of this term in this application, including in any claims. As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and if applicable to the particular claim element, a baseband integrated circuit or processor integrated circuit for a mobile device or a similar integrated circuit in server, a cellular network device, or other computing or network device.

It should be appreciated by those of ordinary skill in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

What is claimed is:

1. An apparatus comprising a data transmitter that comprises an electrical analog front end and a digital signal processor, the digital signal processor being configured to:
   redundancy-encode an input data stream to generate a constellation-symbol stream; and
   drive the analog front end to cause one or more modulated electrical carriers generated by the analog front end to carry constellation symbols of the constellation-symbol stream; and
   wherein the digital signal processor comprises:
      a demultiplexer configured to demultiplex the input data stream to generate a first sub-stream and a second sub-stream;
      a shaping encoder configured to generate a first encoded data stream and a second encoded data stream by applying a shaping code to the first sub-stream; and
      a constellation mapper configured to:
         use the second encoded data stream to select constellation-symbol amplitudes for the constellation-symbol stream; and
         use the first encoded data stream and the second sub-stream to select at least some signs applied to the constellation-symbol amplitudes;
   wherein the digital signal processor further comprises an XOR gate having first and second inputs and an output, the first input being connected to receive the first encoded data stream, the second input being connected to receive a data stream including the second sub-stream, the output being connected to the constellation mapper; and
   wherein the constellation mapper is configured to use bit values received from the output to select at least some signs applied to the constellation-symbol amplitudes.

2. The apparatus of claim 1, further comprising an FEC encoder configured to generate a third encoded data stream by applying an FEC code to the second sub-stream; and
   wherein the constellation mapper is further configured to use the third encoded data stream to select the constellation-symbol amplitudes for the constellation-symbol stream.

3. The apparatus of claim 2, wherein the FEC encoder is configured to use a low-density parity-check code.

4. The apparatus of claim 2,
   wherein the shaping encoder is further configured to generate a fourth encoded data stream by applying the shaping code to the first sub-stream; and
   wherein the FEC encoder is further configured to generate the third encoded data stream by also applying the FEC code to the fourth encoded data stream.

5. The apparatus of claim 2,
   wherein the demultiplexer is further configured to demultiplex the input data stream to generate a third sub-stream; and wherein the FEC encoder is further configured to generate the third encoded data stream by also applying the FEC code to the third sub-stream.

6. The apparatus of claim 2, wherein the constellation mapper is further configured to use the third encoded data stream to select at least some of the signs applied to the constellation-symbol amplitudes.

7. The apparatus of claim 1, further comprising an FEC encoder configured to generate a third encoded data stream by applying an FEC code to the second sub-stream; and
wherein the constellation mapper is further configured to use the third encoded data stream to select at least some of the signs applied to the constellation-symbol amplitudes.

8. The apparatus of claim 1, wherein the constellation mapper is configured to select a constellation-symbol amplitude using a bit-word having a fixed number of bits supplied by the second encoded data stream and a single bit supplied by the second sub-stream.

9. The apparatus of claim 1,
wherein the constellation mapper is configured to perform constellation mapping using a set of binary labels in which different binary labels correspond to different respective constellation symbols, each binary label including a respective sign portion and a respective amplitude portion; and
wherein the amplitude portion is such that, for any pair of constellation symbols that are symmetric with respect to a constellation origin, respective values of a particular bit of the amplitude portion include a binary zero and a binary one.

10. The apparatus of claim 1,
wherein the digital signal processor further comprises a carrier mapper configured to generate a plurality of constellation-symbol sub-streams by partitioning the constellation-symbol stream; and
wherein the digital signal processor is configured to drive the analog front end to cause a plurality of the modulated electrical carriers generated by the analog front end to carry the plurality of said constellation-symbol sub-streams.

11. The apparatus of claim 1, further comprising a modem, the modem including the data transmitter.

12. The apparatus of claim 1, further comprising a service distribution unit, the service distribution unit including the data transmitter.

13. An apparatus comprising a data receiver that comprises an electrical analog front end and a digital signal processor, the digital signal processor being configured to process a stream of values representing one or more modulated carriers of a received electrical signal outputted by the electrical analog front end and corresponding to a stream of transmitted constellation symbols of a constellation, the digital signal processor being configured to redundancy-decode the stream of values to recover a source data stream redundancy-encoded in the stream of transmitted constellation symbols and carried by the one or more modulated electrical carriers; and
wherein the digital signal processor comprises:
a constellation demapper configured to generate a first data stream and a second data stream by mapping each of the stream of values onto the constellation, the first data stream carrying sign bits of binary labels of constellation symbols determined by the mapping, the second stream carrying amplitude bits of the binary labels of the constellation symbols determined by the mapping; and
a shaping decoder configured to recover a first sub-stream of the source data stream by decoding a stream of bit-words generated using the first and second data streams, the decoding being performed using a shaping code;
wherein the digital signal processor further comprises an XOR gate having first and second inputs and an output, the first input being connected to receive the first data stream, the second input being connected to receive a third data stream, the third data stream being generated based on the stream of values; and
wherein the stream of bit-words includes bit values generated at the output of the logic gate.

14. The apparatus of claim 13, further comprising an FEC decoder configured to recover a second sub-stream of the source data stream by applying an FEC code to decode the stream of values; and
wherein the constellation demapper is further configured to use an output of the FEC decoder to perform the mapping.

15. The apparatus of claim 14, wherein the FEC decoder is configured to use a low-density parity-check code.

16. The apparatus of claim 14, wherein the FEC decoder is configured to:
discard parity bits recovered by decoding the stream of values;
regenerate the parity bits by re-encoding information bits recovered by decoding the stream of values; and
direct the regenerated parity bits to the constellation demapper.

17. The apparatus of claim 14,
wherein the digital signal processor further comprises a logic gate having first and second inputs and an output, the first input being connected to receive the first data stream, the second input being connected to receive a third data stream, the third data stream being generated by the FEC decoder by decoding the stream of values; and
wherein the stream of bit-words includes bit values generated at the output of the logic gate.

18. The apparatus of claim 13, further comprising a modem, the modem including the data receiver.

19. The apparatus of claim 13, further comprising a service distribution unit, the service distribution unit including the data receiver.

* * * * *